(12) United States Patent
Liao et al.

(10) Patent No.: US 12,464,954 B2
(45) Date of Patent: Nov. 4, 2025

(54) MAGNETO-RESISTIVE RANDOM-ACCESS MEMORY (MRAM) DEVICES WITH SELF-ALIGNED TOP ELECTRODE VIA

(71) Applicant: Taiwan Semiconductor Manufacturing Company, Ltd., Hsinchu (TW)

(72) Inventors: Wei-Hao Liao, Taichung (TW); Hsi-Wen Tien, Xinfeng Township (TW); Chih-Wei Lu, Hsinchu (TW); Pin-Ren Dai, New Taipei (TW); Chung-Ju Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/336,790

(22) Filed: Jun. 16, 2023

(65) Prior Publication Data

US 2023/0337545 A1    Oct. 19, 2023

Related U.S. Application Data

(60) Continuation of application No. 17/231,419, filed on Apr. 15, 2021, now Pat. No. 11,723,282, which is a division of application No. 16/440,011, filed on Jun. 13, 2019, now Pat. No. 10,985,312.

(51) Int. Cl.
| | | |
|---|---|---|
| *H10N 50/01* | (2023.01) | |
| *H01F 10/32* | (2006.01) | |
| *H01F 41/34* | (2006.01) | |
| *H10B 61/00* | (2023.01) | |
| *H10N 50/80* | (2023.01) | |

(52) U.S. Cl.
CPC ......... *H10N 50/01* (2023.02); *H01F 10/3254* (2013.01); *H01F 41/34* (2013.01); *H10B 61/00* (2023.02); *H10N 50/80* (2023.02)

(58) Field of Classification Search
CPC .... H10N 50/01; H10N 50/80; H01F 10/3254; H01F 41/34; H01F 41/302; H10B 61/00
See application file for complete search history.

(56) References Cited

U.S. PATENT DOCUMENTS

| | | | | |
|---|---|---|---|---|
| 5,091,330 | A | * | 2/1992 | Cambou ........... H01L 21/76264 |
| | | | | 148/DIG. 12 |
| 10,454,021 | B2 | | 10/2019 | Sung et al. |
| 2013/0032775 | A1 | * | 2/2013 | Satoh ................... H10N 70/826 |
| | | | | 257/1 |
| 2013/0032907 | A1 | | 2/2013 | Satoh et al. |

(Continued)

FOREIGN PATENT DOCUMENTS

WO    WO2017/155508    *  9/2017

*Primary Examiner* — Yasser A Abdelaziez
(74) *Attorney, Agent, or Firm* — Birch, Stewart, Kolasch & Birch, LLP

(57) ABSTRACT

An MRAM device includes a bottom electrode over a substrate, a magnetic tunnel junction (MTJ) structure on the bottom electrode and a top electrode on the MTJ structure. The MRAM device also includes spacers on sidewalls of the top electrode and the MTJ structure. The MRAM device further includes a first etch stop layer on the spacers. A bottommost surface of the first etch stop layer covers a topmost surface of the spacers. In addition, the MRAM device includes a top electrode via on the top electrode and the first etch stop layer.

20 Claims, 22 Drawing Sheets

(56) References Cited

U.S. PATENT DOCUMENTS

| | | | |
|---|---|---|---|
| 2013/0062714 A1* | 3/2013 | Zhu | G11C 11/161 |
| | | | 257/E29.323 |
| 2016/0043306 A1* | 2/2016 | Huang | H10N 50/01 |
| | | | 257/427 |
| 2016/0268499 A1* | 9/2016 | You | H10N 50/01 |
| 2016/0365513 A1* | 12/2016 | Sung | H10N 50/01 |
| 2018/0040817 A1* | 2/2018 | Chuang | H10N 70/20 |
| 2018/0097175 A1 | 4/2018 | Chuang et al. | |
| 2018/0175284 A1 | 6/2018 | Hsieh et al. | |
| 2018/0351081 A1* | 12/2018 | Sung | H10N 50/01 |
| 2019/0036014 A1* | 1/2019 | Ha | H10N 50/10 |
| 2019/0096795 A1 | 3/2019 | Chen et al. | |
| 2019/0371996 A1 | 12/2019 | Chuang et al. | |
| 2020/0006638 A1 | 1/2020 | Chen et al. | |
| 2020/0098982 A1 | 3/2020 | Chuang et al. | |
| 2020/0144484 A1 | 5/2020 | Chen et al. | |
| 2020/0328251 A1 | 10/2020 | Dutta et al. | |
| 2021/0091139 A1* | 3/2021 | Tseng | H10N 50/10 |

* cited by examiner

MAGNETO-RESISTIVE RANDOM-ACCESS MEMORY (MRAM) DEVICES WITH SELF-ALIGNED TOP ELECTRODE VIA

PRIORITY CLAIM AND CROSS-REFERENCE

This application is a Continuation application of U.S. patent application Ser. No. 17/231,419, filed Apr. 15, 2021, and entitled "MAGNETO-RESISTIVE RANDOM-ACCESS MEMORY (MRAM) DEVICES WITH SELF-ALIGNED TOP ELECTRODE VIA", which is a Division of U.S. patent application Ser. No. 16/440,011, filed Jun. 13, 2019, now U.S. patent Ser. No. 10,985,312, and entitled "METHODS OF FABRICATING MAGNETO-RESISTIVE RANDOM-ACCESS MEMORY (MRAM) DEVICES WITH SELF-ALIGNED TOP ELECTRODE VIA AND STRUCTURES FORMED THEREBY", the entirety of which is incorporated by reference herein.

BACKGROUND

Semiconductor memory devices are used in integrated circuits (ICs) to store digital data for electronic applications. One type of semiconductor memory device is the spin electronic device, which combines semiconductor technology with magnetic materials and devices. The spin, rather than the charge, of electrons is used to indicate a bit through their magnetic moments. One such spin electronic device is the magneto-resistive random-access memory (MRAM) device. MRAM devices include word-lines and bit-lines which are perpendicular to one another in different metal layers. The word-lines and the bit-lines sandwich MRAM cells. An MRAM cell includes a magnetic tunnel junction (MTJ) structure having a variable resistance, which is located between two electrodes. The MTJ structure changes its resistive state based on the directions of the magnetic moments of two magnetic layers thereof.

MRAM is typically faster and has better endurance than current non-volatile memory, such as flash random access memory. Moreover, MRAM typically has similar performance and lower power consumption than current volatile memory, such as dynamic random access memory (DRAM) and static random access memory (SRAM). MRAM is one promising candidate for next-generation non-volatile memory technology. However, as the semiconductor integrated circuit (IC) industry has progressed into nanometer technology nodes, new challenges are arising in the fabrication of MRAM devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A, 1B, 1C, 1D, 1E, 1F, 1G, 1H, 1I, 1J, 1K, 1L, 1M, 1N-1, 1N-2, 1O-1, 1O-2, 1P and 1Q illustrate cross-sectional views of respective structures at various stages of fabricating a magneto-resistive random-access memory (MRAM) device, in accordance with some embodiments.

DETAILED DESCRIPTION

Figure 1A:
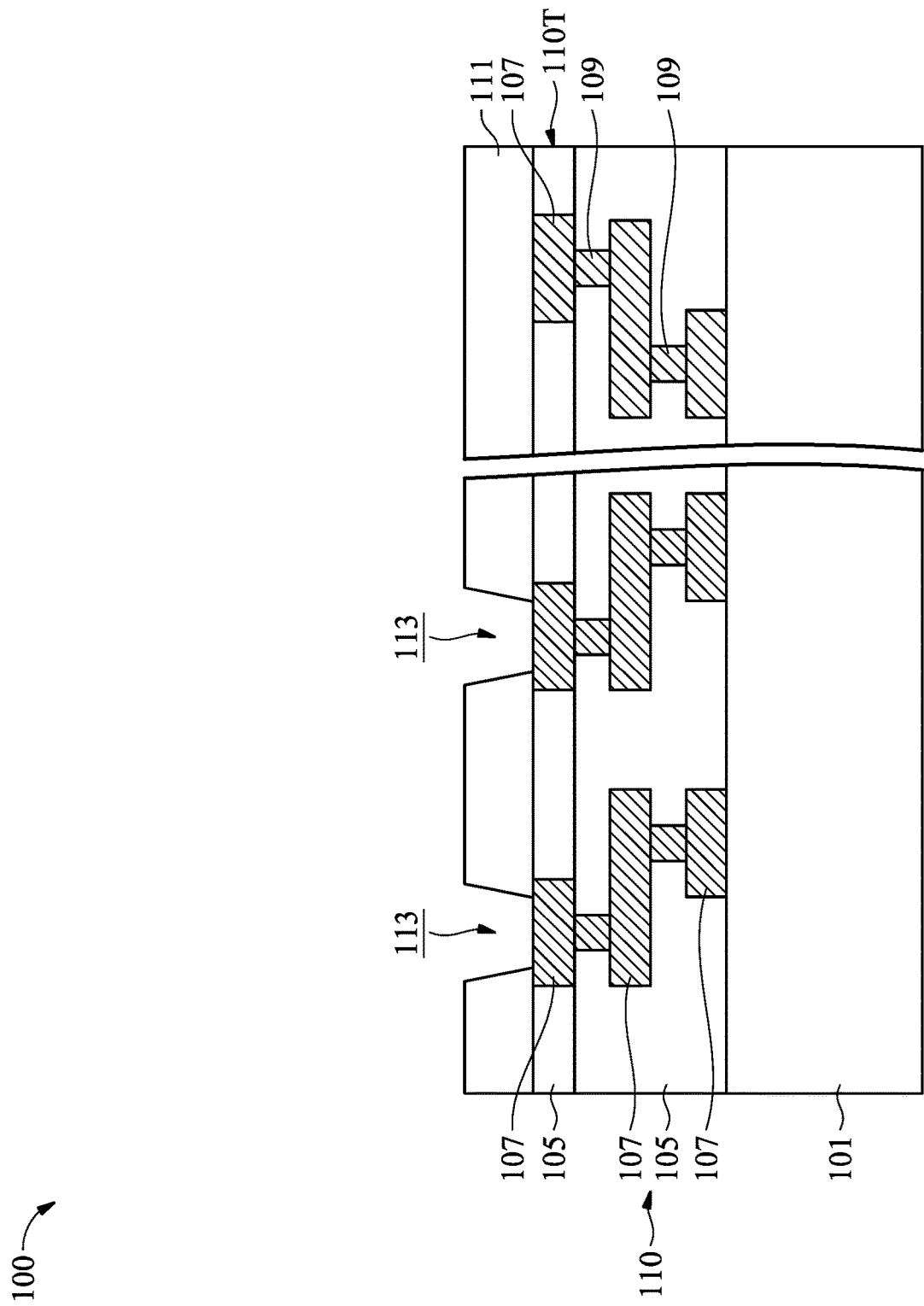

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "under," "above," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) devices have multiple MRAM cells arranged in array. MRAM cells are configured to store data using magnetic storage elements. Typically, MRAM cells include a magnetic tunnel junction (MTJ) structure disposed between a bottom electrode and a top electrode and vertically arranged with a back-end-of-line (BEOL) metal stack. The MTJ structure includes a pinned magnetic layer and a free magnetic layer, which are vertically separated by an insulating barrier layer. The magnetic orientation of the pinned magnetic layer is static (i.e., fixed), while the magnetic orientation of the free magnetic layer is capable of switching between a parallel configuration with respect to that of the pinned magnetic layer and an anti-parallel configuration. The parallel configuration provides for a low resistance state that digitally stores data as a first bit value (e.g., a logical "0"). The anti-parallel configuration provides for a high-resistance state that digitally stores data as a second bit value (e.g., a logical "1").

As the functionality of integrated circuits increases, the need for more memory also increases, causing integrated circuits in design and manufacture to increase the amount of available memory while decreasing the size and power consumption of memory. To reach this goal, the size of memory cell components has been aggressively shrunk over the past few decades. When MRAM technology nodes are developed from 28 nm (N28) to N5 or beyond, the critical dimensions (CD) of MTJ structure (also referred to as MTJ islands) are changed from 80 nm to below 30 nm. In MRAM cells, as the size of MRAM cell components decreases, the ability to align a top electrode via with the top electrode of the MRAM cell becomes increasingly difficult since the overlay tolerance between the top electrode via and the top electrode of the MRAM cell will decrease. As a result, the overlay window of the landing via on the top electrode has become tighten. It has been appreciated that overlay shift can cause a via hole of the top electrode via to be offset from the top electrode and the MTJ structure under the top electrode. The etching process of forming the via hole may etch a spacer on the sidewall of the top electrode and the MTJ structure and further damages the MTJ structure. The worse overlay would need to do rework in the patterned photoresist, otherwise the electrical properties of the MRAM cells would be impacted. Therefore, developing novel self-aligned via approaches is needed for the MRAM cells.

Embodiments disclosed herein relate generally to fabricating MRAM devices with a self-aligned via on a top electrode to achieve good top electrode via alignment for the advanced MRAM processes from N28 to N5 or beyond. The embodiments of the disclosure can avoid damaging an MTJ structure of the MRAM cell through a patterned etch stop layer. The patterned etch stop layer is selectively deposited on spacers and a first dielectric layer by a dielectric on dielectric (DoD) process. The spacers and the first dielectric layer surround the top electrode and the MTJ structure. Next, a second dielectric layer is deposited on the patterned etch stop layer, and then the second dielectric layer is etched to form a via hole of a top electrode via. In an etching process of forming the via hole, the patterned etch stop layer can protect the spacers and the MTJ structure. When a lithography process of a patterned photoresist for forming the via hole has overlay shift, the patterned etch stop layer can prevent the spacers and the MTJ structure from damaging by the etching process of forming the via hole. If the MTJ structure is damaged, the electrical and magnetic properties of the MRAM cells would be impacted. According to embodiments of the disclosure, the spacers and the MTJ structure are not damaged in the etching process of forming the via hole, and a self-aligned top electrode via is formed in the via hole on the top electrode. Therefore, the electrical and magnetic characteristics and performances of the MRAM devices of embodiments of the disclosure are improved.

The foregoing broadly outlines some aspects of the embodiments described herein. Some embodiments described herein are described in the context of MRAM devices, and more particularly, in the context of forming a self-aligned via on a top electrode to avoid damaging an MTJ structure of an MRAM cell. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein. It should be understood that additional steps can be provided before, during, and after the method, and some of the steps described can be replaced, exchanged or eliminated for other embodiments of the method.

Embodiments for fabricating MRAM devices are provided. FIGS. 1A to 1Q illustrate cross-sectional views of respective structures at various stages of fabricating an MRAM device 100, in accordance with some embodiments. A substrate 101 is provided, as shown in FIG. 1A in accordance with some embodiments. The substrate 101 may be a bulk semiconductor substrate or a semiconductor-on-insulator (SOI) substrate, which may be doped (e.g., with a p-type or an n-type dopant) or undoped. Generally, an SOI substrate includes a layer of a semiconductor material formed on an insulator layer. The insulator layer may be a buried oxide (BOX) layer or a silicon oxide layer. The insulator layer may be provided on a silicon or glass substrate. The substrate 101 may be made of silicon or another semiconductor material. For example, the substrate 101 is a silicon wafer. In some examples, the substrate 101 is made of a compound semiconductor such as silicon carbide, gallium arsenic, indium arsenide, or indium phosphide. In some examples, the substrate 101 is made of an alloy semiconductor such as GaAsP, AlInAs, AlGaAs, GaInAs, GaInP, or GaInAsP.

In some embodiments, the substrate 101 includes various p-type doped regions and/or n-type doped regions, such as p-type wells and/or n-type wells, formed by a process such as ion implantation and/or diffusion. The substrate 101 may include functional elements such as resistors, capacitors, diodes, and transistors. The transistors are, for example field effect transistors (FETs), such as planar FETs and/or Fin field effect transistors (FinFETs). The substrate 101 may include lateral isolation features configured to separate various functional elements formed on and/or in the substrate 101.

A lower interconnect structure 110 is formed on the substrate 101, as shown in FIG. 1A in accordance with some embodiments. The lower interconnect structure 110 includes multiple intermetal dielectric (IMD) layers 105, multiple metal lines 107, and multiple conductive vias 109. The metal lines 107 and the conductive vias 109 are embedded in the IMD layers 105. There are multiple contacts (not shown) formed between the lower interconnect structure 110 and the substrate 101 to be electrically coupled to the various functional elements formed on and/or in the substrate 101. In addition, the lower interconnect structure 110 includes an uppermost interconnect layer 110T that includes an uppermost IMD layer 105 and multiple uppermost metal lines 107 embedded in the uppermost IMD layer 105. The metal lines 107 of the same interconnect layer are disposed in the same IMD layer 105 to provide a horizontal electrical connection for various elements of integrated circuits (ICs). The conductive vias 109 in the same IMD layer 105 are disposed between two metal lines 107 to provide a vertical electrical connection.

In some examples, the IMD layers 105 may be made of silicon dioxide ($SiO_2$), silicon oxynitride (SiON), phosphosilicate glass (PSG), borosilicate glass (BSG), borophosphosilicate glass (BPSG), undoped silicate glass (USG), fluorinated silicate glass (FSG), Spin-On-Glass (SOG), or a combination thereof. The IMD layers 105 may be deposited by spin-on coating, chemical vapor deposition (CVD), flowable CVD (FCVD), plasma enhanced CVD (PECVD), physical vapor deposition (PVD), or another deposition process.

The materials of the metal lines 107 and the conductive vias 109 may include aluminum (Al), copper (Cu), gold (Au), tungsten (W), other suitable metal or metal alloy materials, or a combination thereof. The metal lines 107 and the conductive vias 109 may be formed by a dual damascene process, a single damascene process or a combination thereof. A metal material for the metal lines 107 and the conductive vias 109 may be deposited on the IMD layer 105 and to fill the holes in the IMD layer 105 using atomic layer deposition (ALD), PECVD, PVD, or another deposition process. Next, any excess portions of the metal material over the IMD layer 105 are removed by a planarization process such as a chemical mechanical polishing (CMP) process to form the metal lines 107 and the conductive vias 109 in the IMD layer 105.

Still referring to FIG. 1A, an interlayer dielectric (ILD) layer 111 is deposited on the uppermost interconnect layer 110T in accordance with some embodiments. Moreover, the ILD layer 111 is etched to form via holes 113 that are formed to pass through the ILD layer 111 and to be directly above the respective metal lines 107. A partial top surface of the metal line 107 is exposed through the via hole 113. The ILD layer 111 may be made of silicon dioxide ($SiO_2$), silicon oxynitride (SiON) or another dielectric material, and may be deposited by spin-on coating, CVD, FCVD, PECVD, PVD, or another deposition process. The via holes 113 are formed using photolithography and etching processes. The via holes 113 may have slanted sidewalls. A patterned photoresist (not shown) may be formed on the blanketly deposited material layer of the ILD layer 111 using photolithography process. The patterned photoresist has openings corresponding to the locations of the metal lines 107. Then, the blanketly deposited material layer of the ILD layer 111 is etched using the patterned photoresist as an etch mask to form the via holes 113.

Figure 1B:
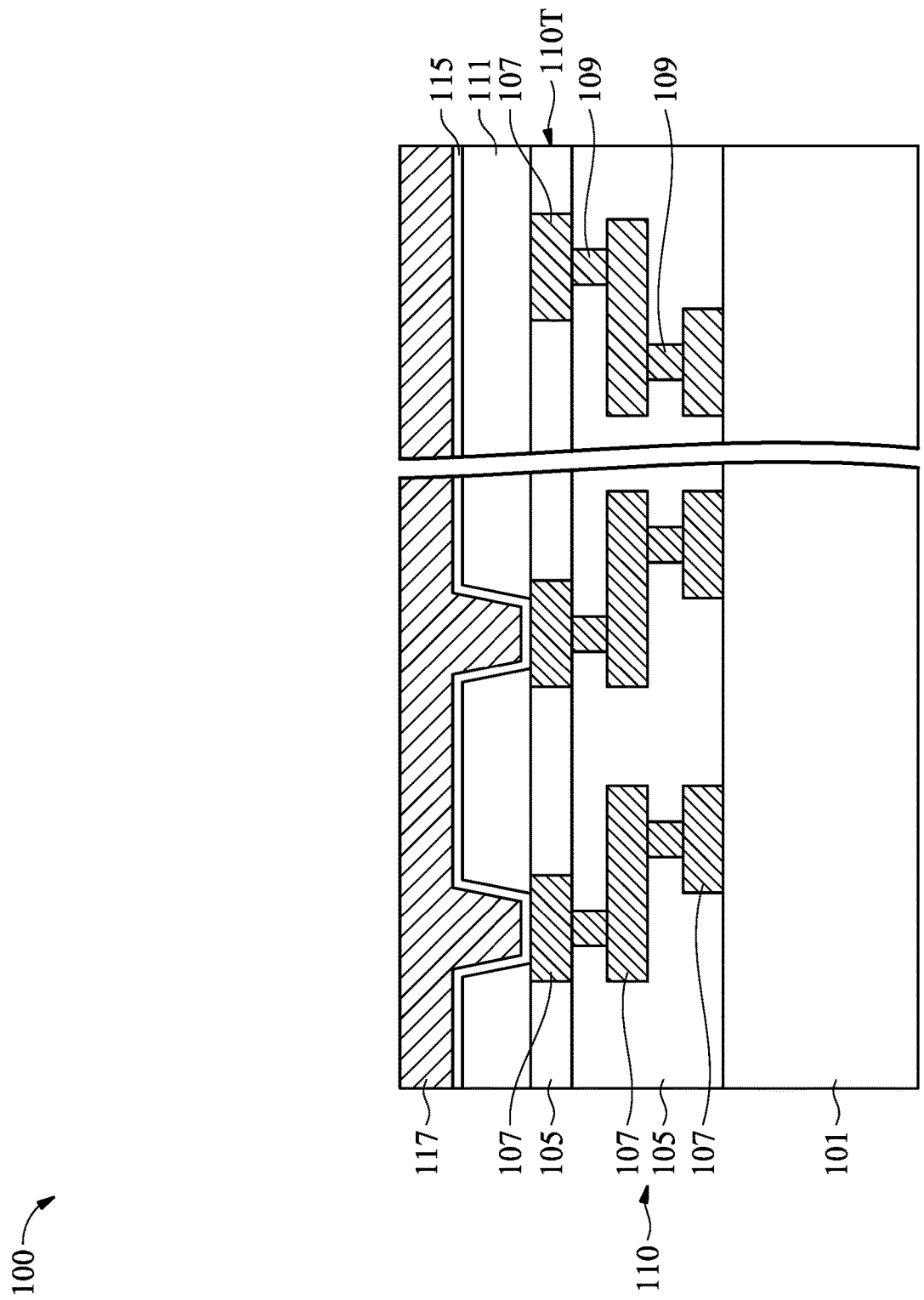

Next, referring to FIG. 1B, a barrier layer 115 is deposited on the ILD layer 111 and in the via holes 113 in accordance with some embodiments. The barrier layer 115 is conformally deposited on the sidewalls and the bottom surface of the via holes 113. The material of the barrier layer 115 includes titanium (Ti), tantalum (Ta), tungsten (W), titanium nitride (TiN), tantalum nitride (TaN), tungsten nitride (WN) or a combination thereof. The barrier layer 115 may be deposited using PVD, CVD, ALD, PECVD or a combination thereof. In some examples, the barrier layer 115 has a thickness that is in a range from about 5 Å to about 50 Å.

Afterwards, still referring to FIG. 1B, a conductive material layer 117 is deposited on the barrier layer 115 in accordance with some embodiments. The conductive material layer 117 is deposited over the ILD layer 111 and to fill the via holes 113. The conductive material layer 117 is made of low electrical resistance materials such as metal, metal alloy, metal nitride or a combination thereof. The conductive material layer 117 is for example titanium nitride (TiN), tantalum (Ta), copper (Cu), tantalum nitride (TaN), titanium (Ti), cobalt (Co), tungsten (W), aluminum (Al), gold (Au), aluminum-copper alloy (AlCu) or other suitable conductive material(s) or layered combination thereof. The conductive material layer 117 may be deposited using PVD, CVD, ALD, or other suitable deposition process. In some examples, the conductive material layer 117 has a thickness that is in a range from about 500 Å to about 1000 Å.

Figure 1C:
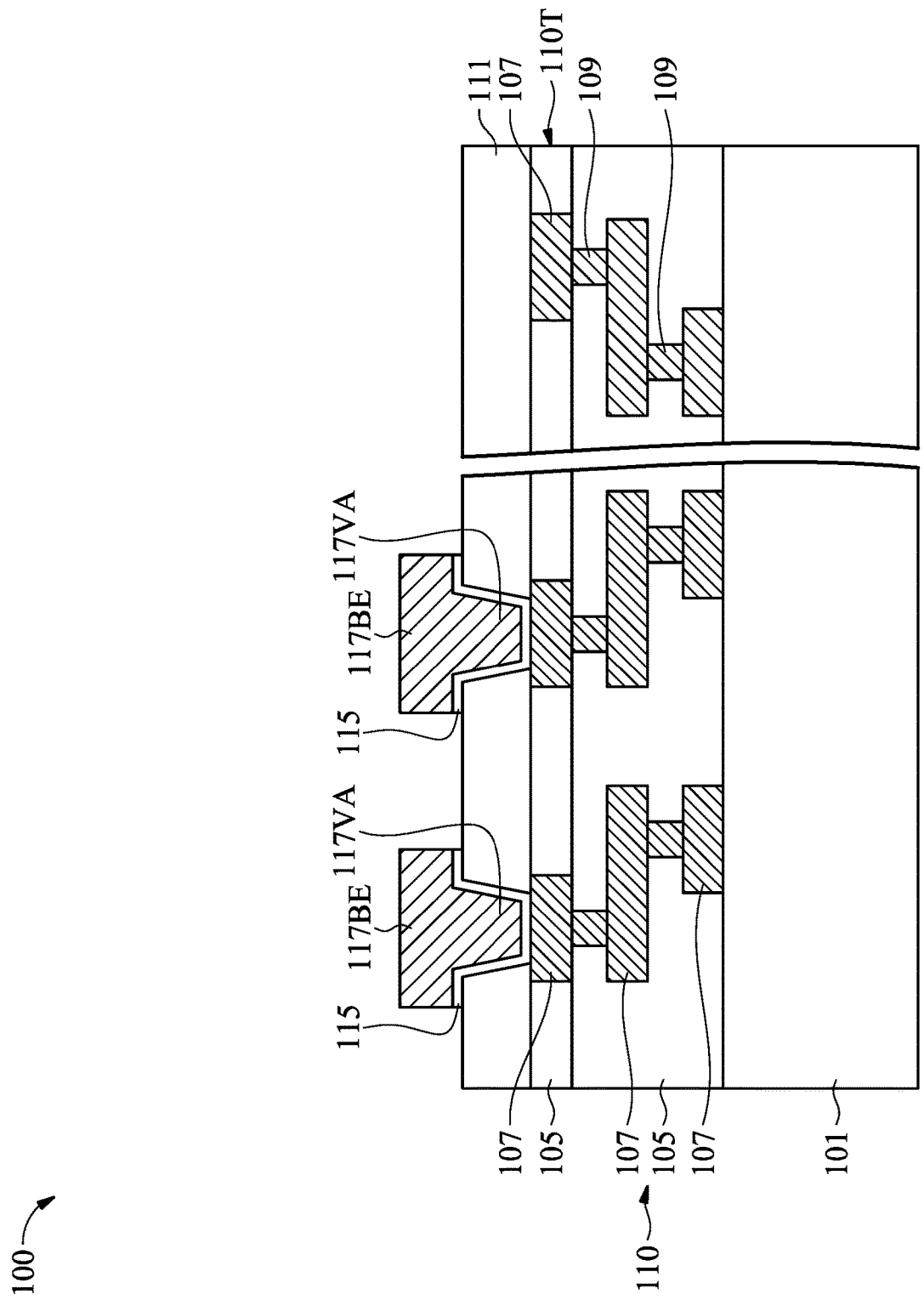

Next, referring to FIG. 1C, the conductive material layer 117 and the barrier layer 115 are patterned together to form multiple bottom electrodes 117BE and multiple bottom electrode vias 117VA in accordance with some embodiments. The portion of the conductive material layer 117 above the ILD layer 111 is patterned to form the bottom electrodes 117BE. Another portion of the conductive material layer 117 in the via holes 113 forms the bottom electrode vias 117VA. Each of the bottom electrode vias 117VA is disposed under and is connected with the respective bottom electrode 117BE. The bottom electrode via 117VA and the bottom electrode 117BE are combined to be an integrated structure made of the same material. The barrier layer 115 is disposed between the bottom electrode vias 117VA and the ILD layer 111 and can be used as a diffusion barrier layer, an adhesion layer or a combination thereof. The conductive material layer 117 and the barrier layer 115 are patterned together using photolithography and etching processes.

Figure 1D:
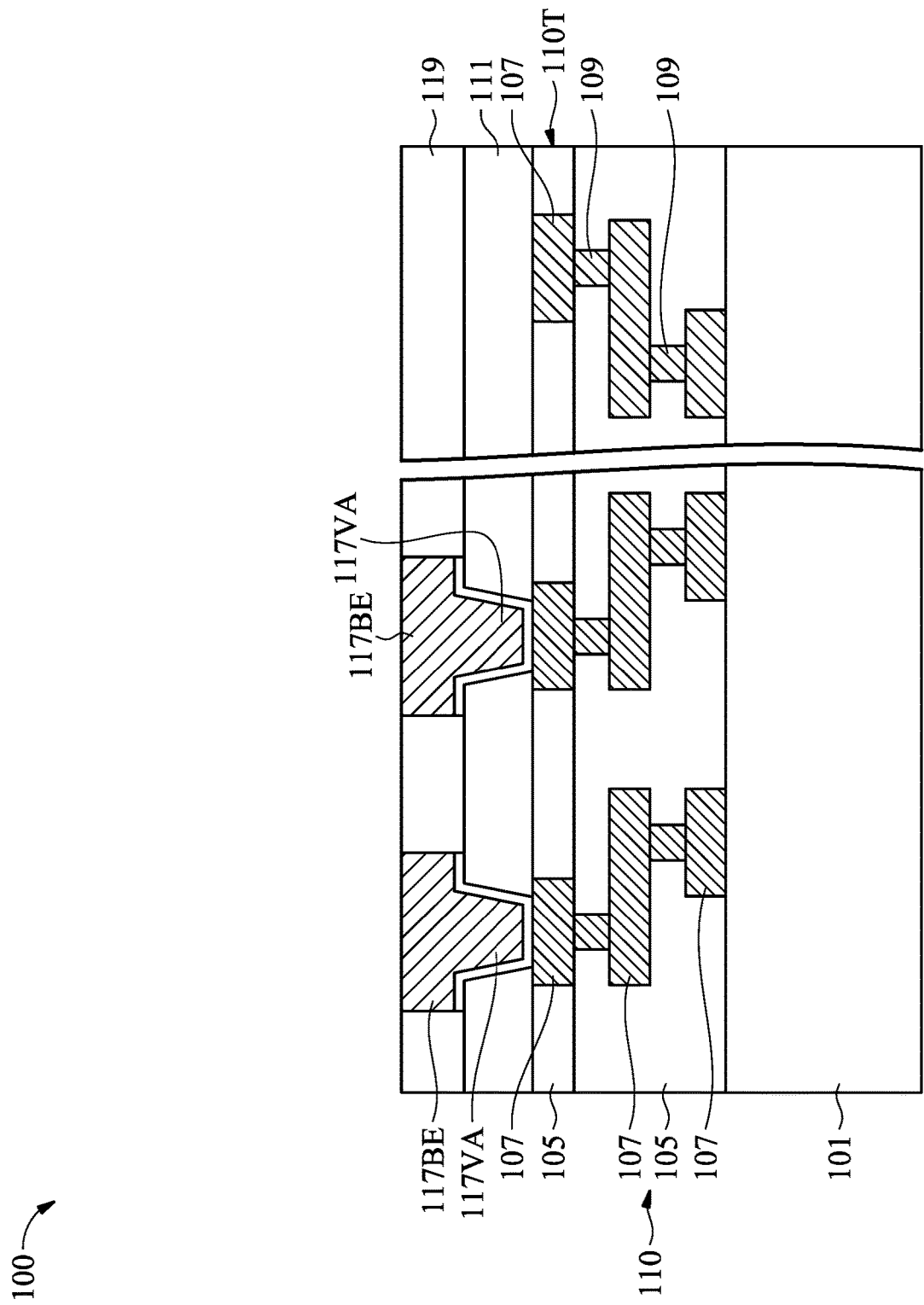

Afterwards, referring to FIG. 1D, an etch stop layer 119 is deposited on the ILD layer 111 to surround the bottom electrodes 117BE in accordance with some embodiments. In some embodiments, the material of the etch stop layer 119 may include SiCN, SiN, $SiO_2$, SiC, SiOC, a low dielectric constant (k) dielectric material, another suitable dielectric material, or a combination thereof. The etch stop layer 119 may be deposited by CVD, ALD, spin-on coating or other suitable deposition process. The etch stop layer 119 may be deposited over the bottom electrodes 117BE and the ILD layer 111, and then a planarization process such a CMP process is performed to remove excess portions of the deposited etch stop layer 119 on the bottom electrodes 117BE. After the CMP process, the bottom electrodes 117BE are exposed through the etch stop layer 119. The bottom electrodes 117BE and the etch stop layer 119 may have a coplanar top surface. In some instances, the top surface of the etch stop layer 119 is slightly lower than that of the bottom electrodes 117BE. In some examples, the etch stop layer 119 has a thickness in a range from about 200 Å to about 500 Å.

Figure 1E:
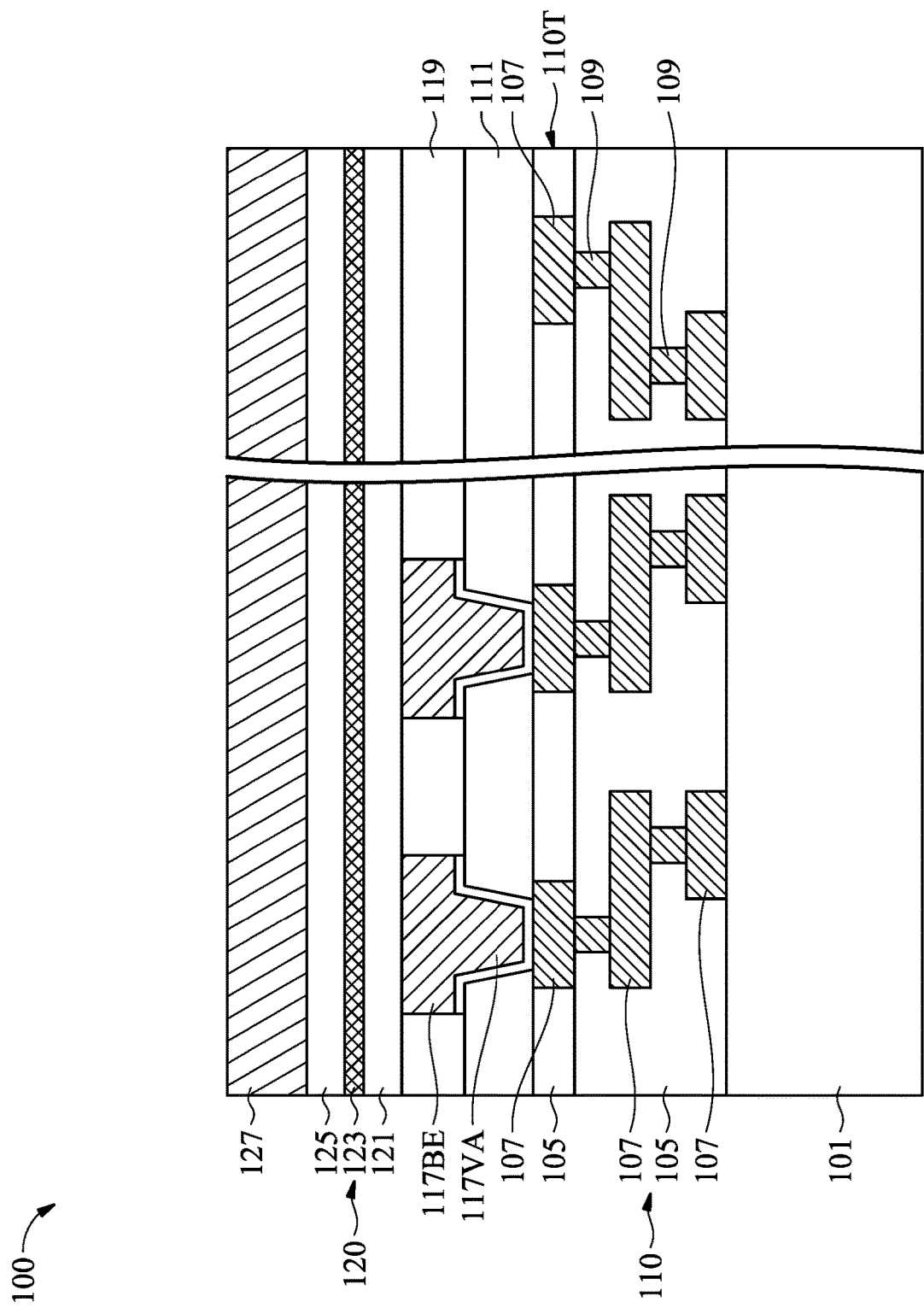

Next, referring to FIG. 1E, an MTJ stacked material layer 120 is deposited on the bottom electrodes 117BE and the etch stop layer 119, and then a top electrode material layer 127 is deposited on the MTJ stacked material layer 120 in accordance with some embodiments. According to embodiments of the disclosure, the conductive material layer 117 is patterned to form the bottom electrodes 117BE before depositing MTJ stacked material layer 120. The MTJ stacked material layer 120 includes a first ferromagnetic layer 121 arranged over the bottom electrodes 117BE and the etch stop layer 119, an insulating barrier layer 123 arranged over the first ferromagnetic layer 121, and a second ferromagnetic layer 125 arranged over the insulating barrier layer 123. In some embodiments, the first ferromagnetic layer 121 is a pinned layer, and the second ferromagnetic layer 125 is a free layer. In this case, an anti-ferromagnetic (AFM) layer (not shown) is arranged under the first ferromagnetic layer 121 and above the bottom electrodes 117BE and the etch stop layer 119.

In some other embodiments, the first ferromagnetic layer 121 is a free layer, and the second ferromagnetic layer 125 is a pinned layer. In this case, an AFM layer (not shown) is arranged under the second ferromagnetic layer 125 and above the insulating barrier layer 123.

The AFM layer may be made of platinum manganese (PtMn), iridium manganese (IrMn), rhodium manganese (RhMn) or iron manganese (FeMn). The ferromagnetic layer arranged on the AFM layer can be used as a pinned layer due to the magnetic moment of the pinned layer is pinned in a particular direction by the AFM layer. The AFM layer may be deposited using various deposition processes such as CVD, PVD, or ALD process. The AFM layer may have a thickness in a range from about 80 Å to about 200 Å.

The pinned layer of the MTJ structure does not change its magnetic moment during operation of the MRAM cells. The pinned layer such as the first ferromagnetic layer 121 or the second ferromagnetic layer 125 may be made of CoFeB, CoFeTa, NiFe, Co, CoFe, CoPt, CoPd, FePt, Ru, or other alloys of Ni, Co and Fe. The pinned layer may be deposited using various deposition processes such as CVD, PVD, or ALD process. In some examples, the pinned layer may have a thickness in a range from about 30 Å to about 100 Å.

Unlike the pinned layer, the magnetic moment direction of the free layer of the MTJ structure can change under various conditions during operation of the MRAM cells because there is no AFM layer adjacent to the free layer. The free layer such as the first ferromagnetic layer 121 or the second ferromagnetic layer 125 is also made of a ferromagnetic material, for example CoFeB, CoFeTa, NiFe, Co, CoFe, CoPt, CoPd, FePt, Ru, or other alloys of Ni, Co and Fe. The free layer may be deposited using various deposition processes such as CVD, PVD, or ALD process. In some examples, the free layer may have a thickness in a range from about 10 Å to about 30 Å.

The insulating barrier layer 123 may be made of dielectric material, such as magnesium oxide (MgO), aluminum oxide (AlOx or $Al_2O_3$), aluminum nitride (AlN), aluminum oxynitride (AlON), other suitable materials, or a combination thereof. The insulating barrier layer 123 may be deposited using various deposition processes such as CVD, PVD, or ALD process. In some examples, the insulating barrier layer 123 may have a thickness in a range from about 1 Å to about 50 Å.

The top electrode material layer 127 is deposited on the second ferromagnetic layer 125, as shown in FIG. 1E in accordance with some embodiments. The top electrode material layer 127 may be made of a conductive material, such as tantalum (Ta), tantalum nitride (TaN), titanium (Ti), titanium nitride (TiN), copper (Cu), cobalt (Co), tungsten (W), aluminum (Al), gold (Au), aluminum-copper alloy (AlCu) or other suitable conductive material(s) or layered combination thereof. The top electrode material layer 127 may be deposited by PVD, CVD, ALD or other suitable deposition process. In some examples, the top electrode material layer 127 has a thickness in a range from about 100 Å to about 600 Å.

Figure 1F:
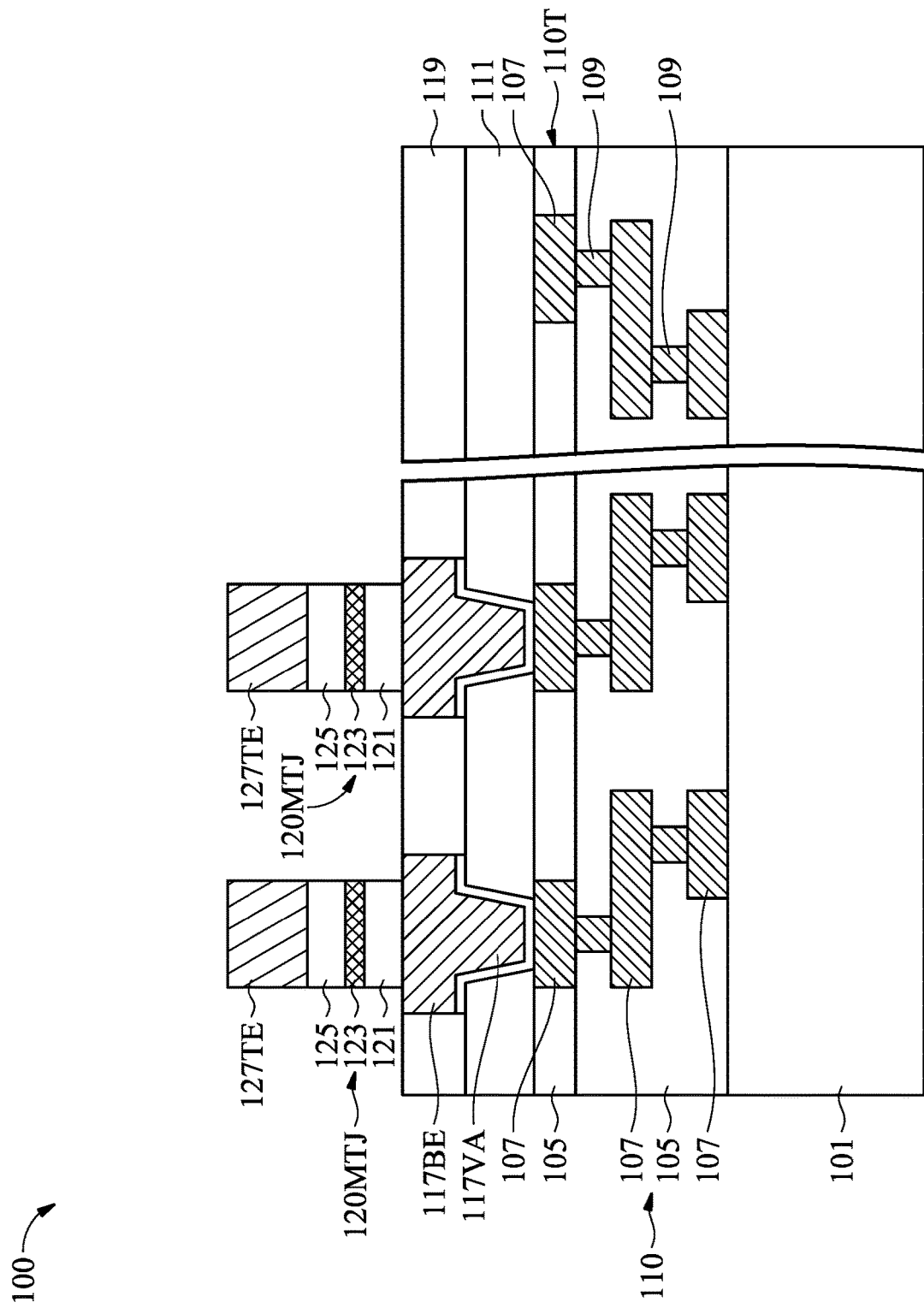

Afterwards, referring to FIG. 1F, the top electrode material layer 127 and the MTJ stacked material layer 120 are patterned together to form multiple top electrodes 127TE and multiple MTJ structures 120MTJ in accordance with some embodiments. The MTJ structures 120MTJ are disposed under the respective top electrodes 127TE. Each of the MTJ structure 120MTJ includes the patterned first ferromagnetic layer 121, the patterned insulating barrier layer 123 and the patterned second ferromagnetic layer 125 stacked on the bottom electrode 117BE in sequence. Moreover, the sidewalls of the top electrode 127TE may be vertically aligned with the sidewalls of the MTJ structure 120MTJ.

The top electrode material layer 127 and the MTJ stacked material layer 120 are patterned using photolithography and etching processes. An etch mask (not shown) is formed on the top electrode material layer 127 and is used in the etching process. In some embodiments, the etch mask is a patterned photoresist formed by the photolithography process. The photolithography process may include coating, exposure and developing a photoresist layer. The photoresist layer is coated on the top electrode material layer 127 by a suitable process, such as spin-on coating. The photoresist layer is then exposed to a light source through a photomask. The exposed photoresist layer is then developed to form the patterned photoresist. The photolithography process may further include one or more baking process, such as soft baking, post exposure baking and hard baking. The photolithography process may alternatively include other technique, such as electron-beam direct writing, or mask-less lithography.

In some other embodiments, the etch mask is a hard mask. In this case, a hard mask layer is deposited on the top electrode material layer 127 and then a patterned photoresist is formed on the hard mask layer. The patterned photoresist is formed by the photolithography process mentioned as the foregoing. Next, an etching process is applied to the hard mask layer to transfer the pattern from the patterned photoresist to the hard mask layer to form the hard mask.

In some embodiments, the top electrode material layer 127 and the MTJ stacked material layer 120 are etched together by an ion beam etch (IBE) process. The IBE process may use an etching gas such as He, Ne, Ar, Kr, Xe or a combination thereof. In some examples, the IBE process is performed with a power in a range from about 50 W to about 3000 W. In some embodiments, the top electrode material layer 127 and the MTJ stacked material layer 120 are etched separately using different process conditions of the IBE process. In some embodiments, the top electrode material layer 127 and the MTJ stacked material layer 120 are etched together in one step of the same etching process condition. As a result, the top electrodes 127TE are formed on the respective MTJ structures 120MTJ.

In some embodiments, the top electrode material layer 127 and the MTJ stacked material layer 120 are etched by a reactive-ion-etch (RIE) process. The RIE process may use an etching gas such as $CH_4$, a CHF species (including $CH_3F$, $CH_2F_2$, or $CHF_3$), a CF species (including $C_4F_8$, $C_4F_6$, or $CF_4$), $H_2$, HBr, CO, $CO_2$, $O_2$, $BCl_3$, $Cl_2$, $N_2$, He, Ne, Ar or a combination thereof. In some examples, the RIE process is performed with a power of about 150 W to about 3000 W, and a bias of about 0V to about 2000V. The top electrode material layer 127 and the MTJ stacked material layer 120 may be etched separately using different process conditions of the RIE process. Alternatively, the top electrode material layer 127 and the MTJ stacked material layer 120 may be etched together in one step of the same process condition.

Figure 1G:
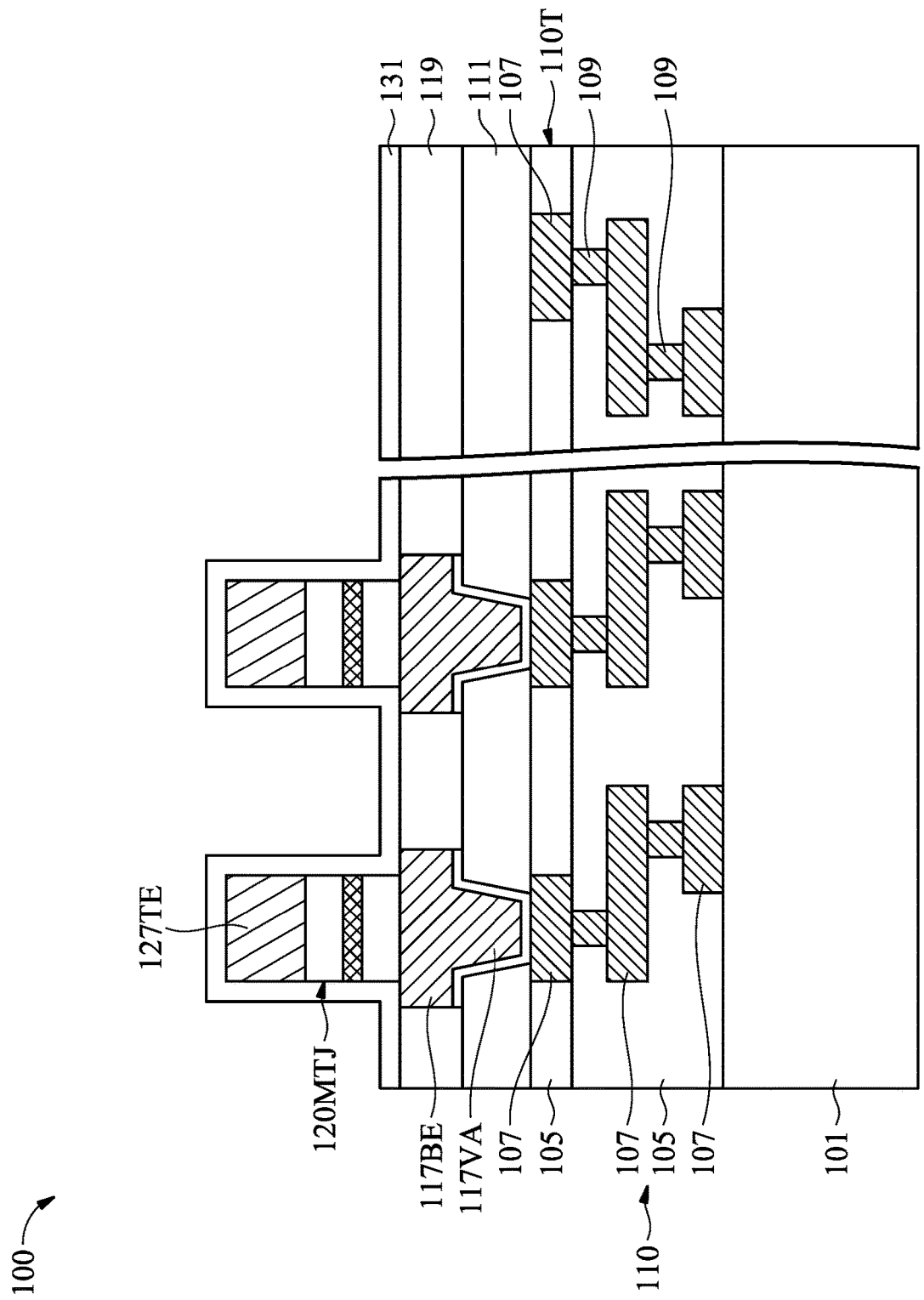

Next, referring to FIG. 1G, a first spacer layer 131 is conformally deposited on the top surfaces of the top electrodes 127TE, the sidewalls of the top electrodes 127TE, the sidewalls of the MTJ structures 120MTJ, and the exposed top surfaces of the etch stop layer 119 and the bottom electrodes 117BE in accordance with some embodiments. The materials of the first spacer layer 131 include silicon oxide ($SiO_2$), silicon nitride (SiN), silicon carbide (SiC), silicon carbon nitride (SiCN) or another dielectric material. The first spacer layer 131 may be deposited by CVD, PECVD, ALD, PVD, sputtering or another deposition process at a temperature of about 180° C. to about 350° C. In some examples, the first spacer layer 131 has a thickness of about 50 Å to about 250 Å.

Figure 1H:
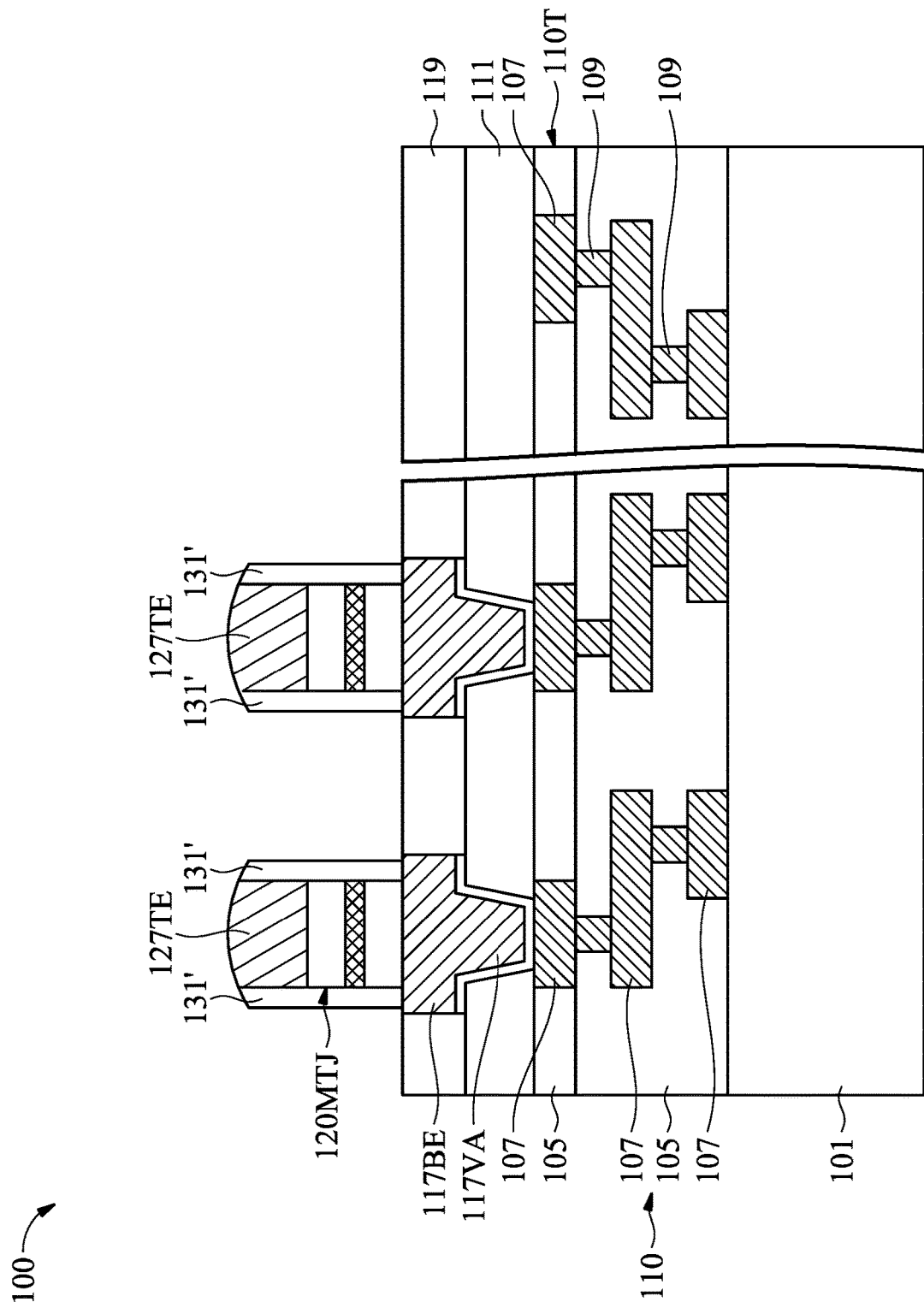

Next, referring to FIG. 1H, the first spacer layer 131 is etched to form a first spacer 131' on the sidewalls of the top electrodes 127TE and the MTJ structures 120MTJ in accordance with some embodiments. The first spacer 131' covers the exposed top surfaces of the bottom electrodes 117BE. The first spacer layer 131 is etched by an anisotropic etching process such as an inductively-coupled-plasma (ICP) type reactive-ion-etch (RIE) process. The ICP type RIE process may use an etching gas selected from a group consisting of $CH_4$, $H_2$, $Cl_2$, HBr, $N_2$, $CF_4$, $CHF_3$, $C_4F_6$, $CH_3F$, $SiCl_4$, CO, $CO_2$, $O_2$, He, Ne, Ar and another suitable gas. In some examples, the ICP type RIE process is performed with a transformer coupled plasma (TCP) power of about 100 W to about 2000 W, and a bias voltage of about 0V to about 800V.

Figure 1I:
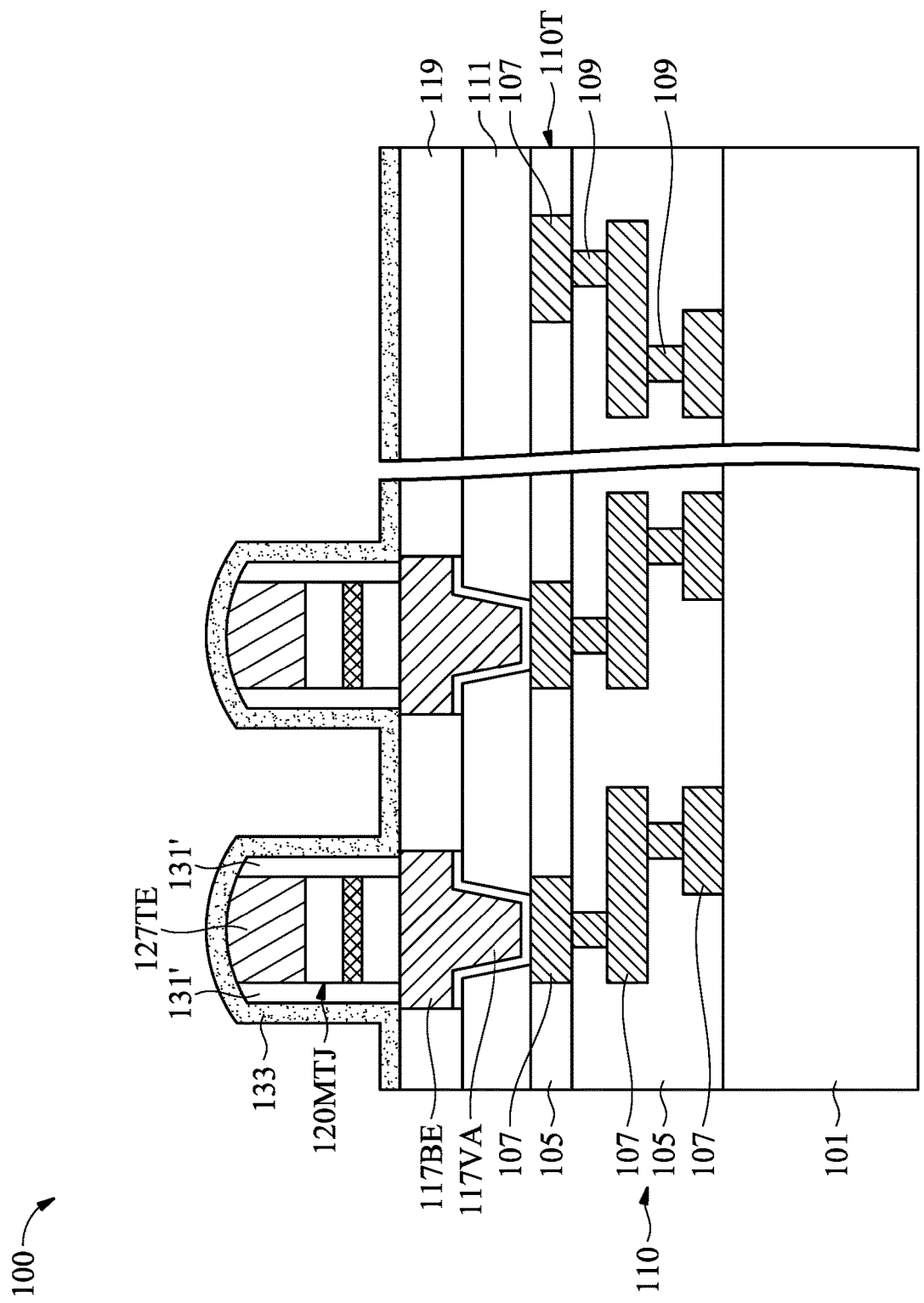

Afterwards, referring to FIG. 1I, a second spacer layer 133 is conformally deposited on the top surfaces of the top electrodes 127TE, the sidewalls of the first spacer 131' and the top surface of the etch stop layer 119 in accordance with some embodiments. The material of the second spacer layer 133 includes silicon oxide ($SiO_2$), silicon nitride (SiN), silicon carbide (SiC), silicon carbon nitride (SiCN) or another dielectric material. In some instances, the first spacer layer 131 and the second spacer layer 133 are made of different materials. For example, the first spacer layer 131 is made of SiC, and the second spacer layer 133 is made of SiN. The second spacer layer 133 may be deposited by CVD, PECVD, ALD, PVD, sputtering or another deposition process at a temperature of about 180° C. to about 350° C.

In some examples, the second spacer layer 133 has a thickness of about 50 Å to about 250 Å.

Figure 1J:
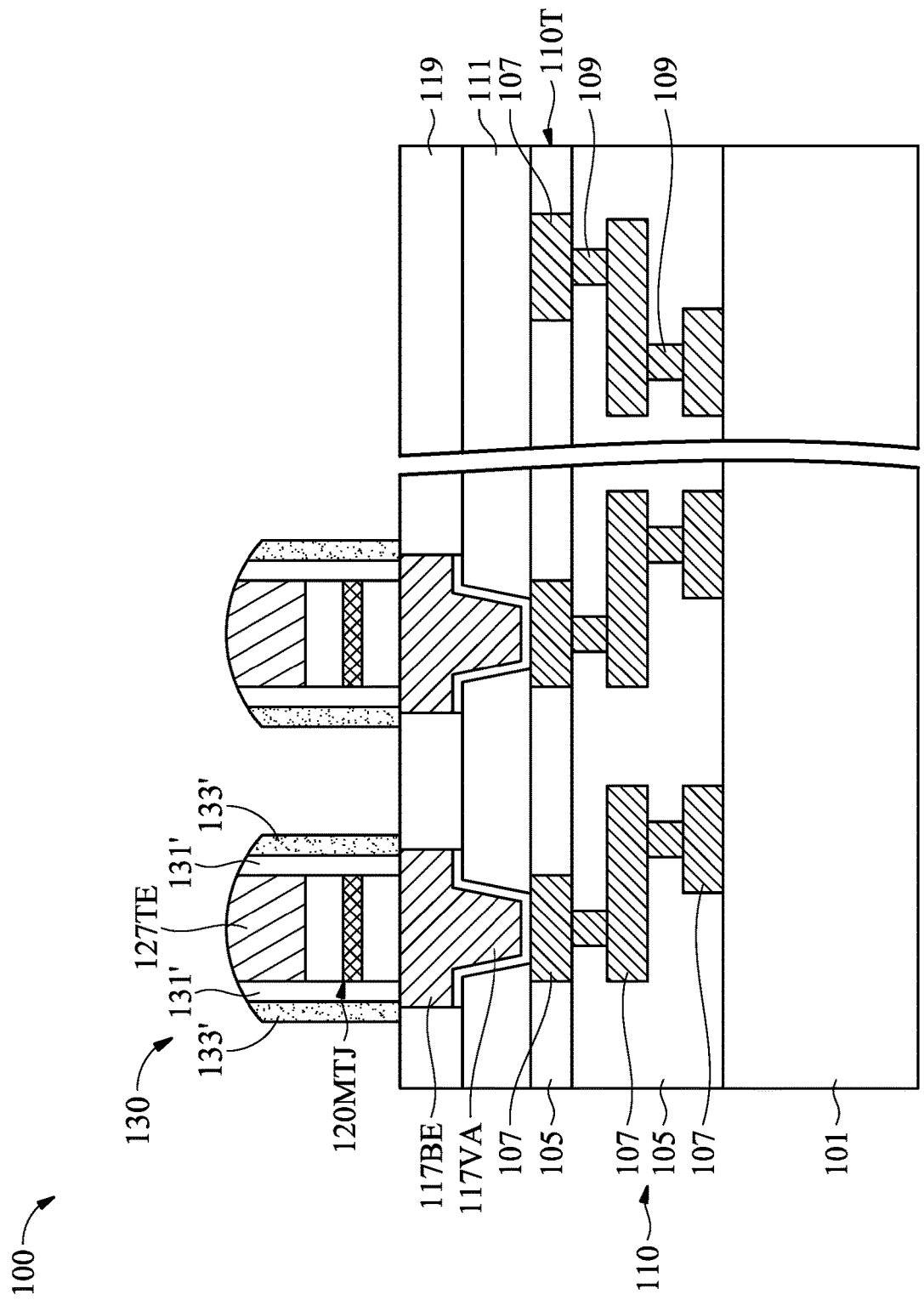

Next, referring to FIG. 1J, the second spacer layer 133 is etched to form a second spacer 133' on the outer surface of the first spacer 131' in accordance with some embodiments. The second spacer 133' also covers a partial top surface of the etch stop layer 119. The second spacer layer 133 is etched by anisotropic etching process such as an ICP type RIE process. The ICP type RIE process may use an etching gas that is selected from a group consisting of $CH_4$, $H_2$, $Cl_2$, HBr, $N_2$, $CF_4$, $CHF_3$, $C_4F_6$, $CH_3F$, $SiCl_4$, CO, $CO_2$, $O_2$, He, Ne, Ar and another suitable gas. In some examples, the ICP type RIE process is performed with a transformer coupled plasma (TCP) power in a range from about 100 W to about 2000 W, and a bias voltage in a range from about 0V to about 800V. The first spacer 131' and the second spacer 133' are together referred to as spacers 130 on the sidewalls of the top electrode 127TE and the MTJ structure 120MTJ.

Figure 1K:
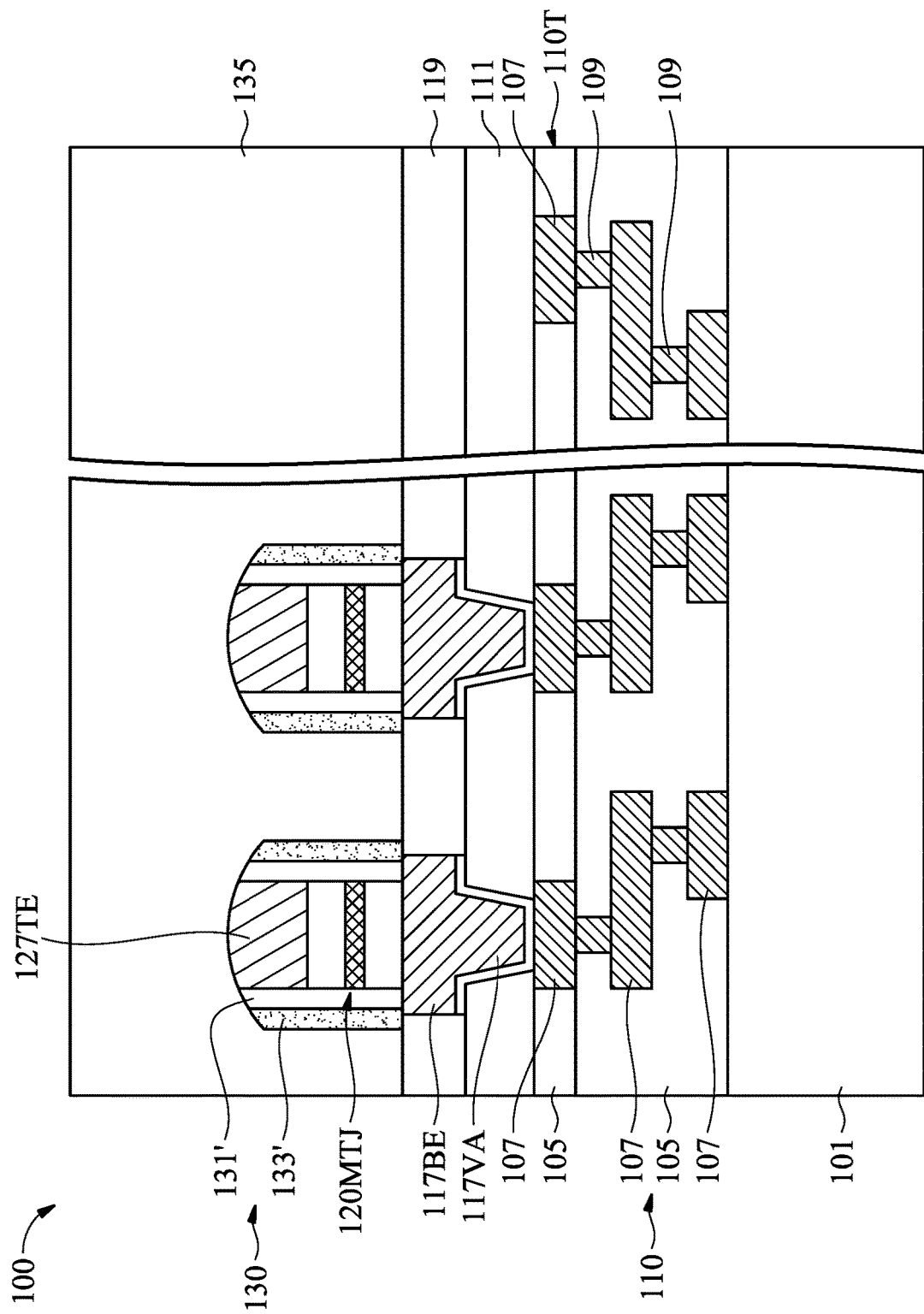

Afterwards, referring to FIG. 1K, a first dielectric layer 135 is deposited on the etch stop layer 119 to cover the spacers 130 and the top electrodes 127TE in accordance with some embodiments. The first dielectric layer 135 may be made of a low dielectric constant (low-k) dielectric material that includes spin-On-Glass (SOG), silicon dioxide ($SiO_2$), silicon oxynitride (SiON), phosphosilicate glass (PSG), borosilicate glass (BSG), borophosphosilicate glass (BPSG), undoped silicate glass (USG), fluorinated silicate glass (FSG) or a combination thereof. The first dielectric layer 135 may be deposited by spin-on coating, CVD, FCVD, PECVD, PVD, or another deposition process. In some examples, the deposited first dielectric layer 135 has a thickness in a range from about 800 Å to about 1000 Å.

Figure 1L:
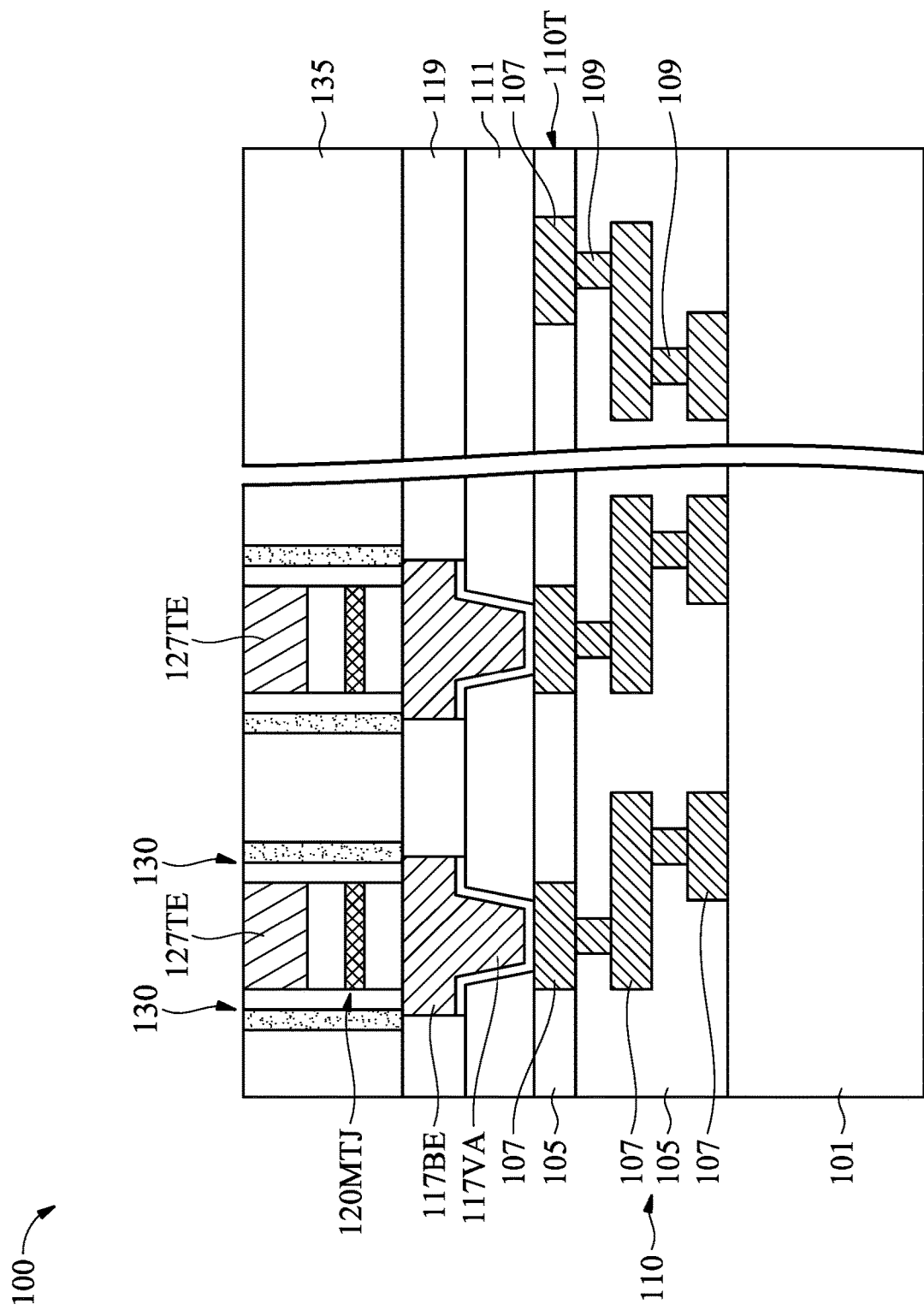

Afterwards, referring to FIG. 1L, the deposited first dielectric layer 135 is etched back in an etching process to expose the top surfaces of the top electrodes 127TE and the spacers 130 in accordance with some embodiments. Thereafter, the first dielectric layer 135, the top electrodes 127TE and the spacers 130 may have a coplanar top surface. The etching process may be a capacitively-coupled-plasma (CCP) type RIE process. The CCP type RIE process may use an etching gas that is selected from a group consisting of $CH_4$, $H_2$, $Cl_2$, $SiCl_4$, $BCl_3$, $CF_4$, $CHF_3$, $CH_3F$, $CH_2F_2$, $C_4F_8$, $C_4F_6$, $N_2$, $O_2$, CO, $CO_2$, He, Ne, Ar and another suitable gas. In some examples, the CCP type RIE process is performed with a high frequency (HF) power of about 100 W to about 1500 W, and a low frequency (LF) power of about 100 W to about 1000 W.

Figure 1M:
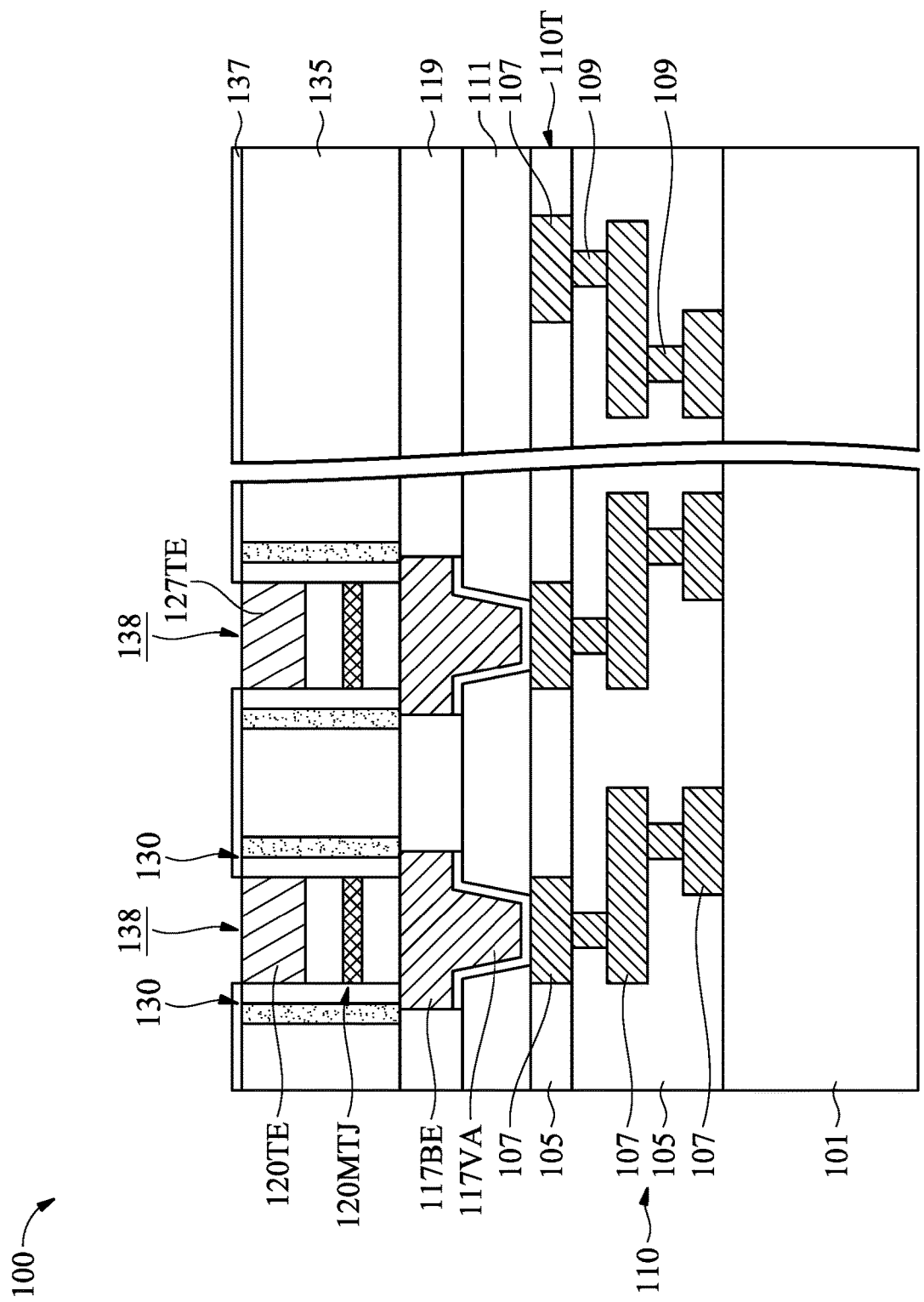

Next, referring to FIG. 1M, a patterned etch stop layer 137 is selectively deposited on the first dielectric layer 135 and the spacers 130 by a dielectric on dielectric (DoD) process in accordance with some embodiments. The patterned etch stop layer 137 has multiple openings 138 to expose the top electrodes 127TE. The patterned etch stop layer 137 may be made of a high electrical resistance material or a high dielectric constant (k) material. The high electrical resistance material includes metal oxide such as aluminum oxide (AlOx or $Al_2O_3$), aluminum oxynitride (AlON), titanium oxide ($TiO_2$), zirconium oxide ($ZrO_2$) or hafnium oxide ($HfO_2$).

According to the embodiments of the disclosure, the patterned etch stop layer 137 is formed by the DoD process to be selectively deposited on the first dielectric layer 135 and the spacers 130, and not deposited on the top electrodes 127TE. The patterned etch stop layer 137 may be deposited using ALD, CVD or another suitable process. In some embodiments, the surfaces of the top electrodes 127TE are chemically modified with self-assembled monolayers (SAMs), and then the patterned etch stop layer 137 is deposited on the first dielectric layer 135 and the spacers 130 using an ALD process. Afterwards, the SAMs are stripped from the surfaces of the top electrodes 127TE using a mild aqueous acid solution such as sulfonic acid, sulfinic acid or carboxylic acid. The SAMs are used as a blocking layer on the top electrodes 127TE and may be organic SAMs such as alkanethiol, alkylphosphonic acid or a combination thereof. In addition, a mild etchant may be used to selectively remove the deposited material of the patterned etch stop layer 137 on the top electrodes 127TE. In some examples, the patterned etch stop layer 137 has a thickness in a range from about 10 Å to about 50 Å.

Figures 1, 1N:
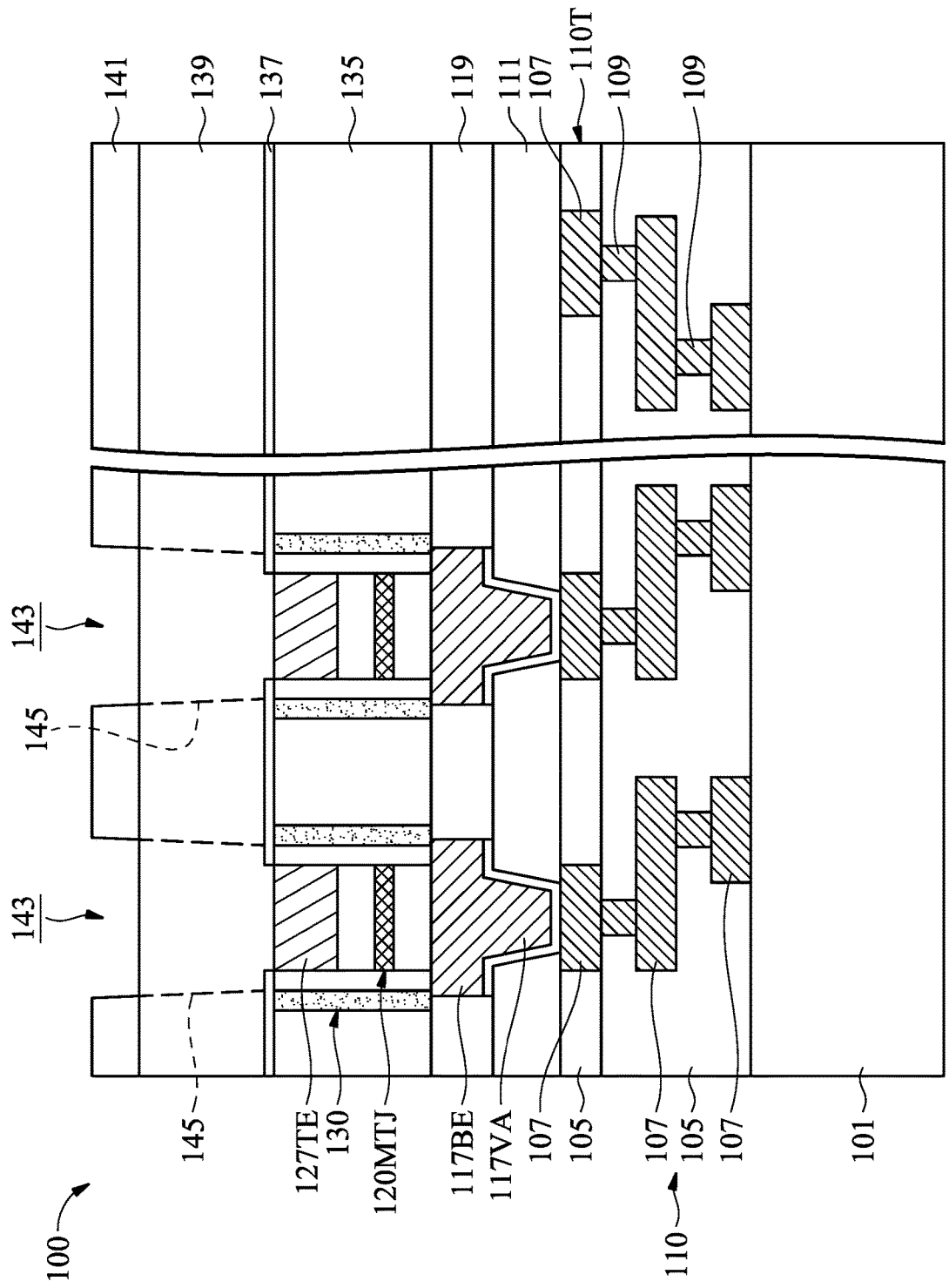

Afterwards, referring to FIG. 1N-1, a second dielectric layer 139 is deposited on the patterned etch stop layer 137 and the top electrodes 127TE in accordance with some embodiments. In addition, a patterned photoresist 141 is formed on the second dielectric layer 139. The patterned photoresist 141 has multiple openings 143 that expose some regions 145 of the second dielectric layer 139. The regions 145 are directly above the top electrodes 127TE and will be removed to form via holes in the second dielectric layer 139. In some instances, the locations of the regions 145 are aligned with the top electrodes 127TE without overlay shift after the photolithography process of forming the patterned photoresist 141.

The material of the second dielectric layer 139 may be the same as or different from the material of the first dielectric layer 135. The second dielectric layer 139 may be made of a low dielectric constant (low-k) dielectric material that includes spin-On-Glass (SOG), silicon dioxide ($SiO_2$), silicon oxynitride (SiON), phosphosilicate glass (PSG), borosilicate glass (BSG), borophosphosilicate glass (BPSG), undoped silicate glass (USG), fluorinated silicate glass (FSG) or a combination thereof. The second dielectric layer 139 may be deposited by spin-on coating, CVD, FCVD, PECVD, PVD, or another deposition process. In some examples, the deposited second dielectric layer 139 has a thickness in a range from about 500 Å to about 700 Å.

Next, referring to FIG. 1O-1, the second dielectric layer 139 is etched to form multiple via holes 147 using the patterned photoresist 141 as an etch mask in accordance with some embodiments. The via holes 147 are formed to pass through the second dielectric layer 139 and to expose the respective top electrodes 127TE. The regions 145 of the second dielectric layer 139 (FIG. 1N-1) are removed to form the via holes 147 in an etching process. In some embodiments, the second dielectric layer 139 has an etching selectivity to the patterned etch stop layer 137 in the etching process, and the etching selectivity is in a range from about 10 to about 20. According the embodiments of the disclosure, during the etching process of forming the via holes 147, the patterned etch stop layer 137 can protect the spacers 130 and the MTJ structures 120MTJ and can prevent the MTJ structures 120MTJ from damaging in the etching process. The etching process may be a CCP type RIE process. The ICP type RIE process may use an etching gas that is selected from a group consisting of $CH_4$, $H_2$, $Cl_2$, $SiCl_4$, $BCl_3$, $CF_4$, $CHF_3$, $CH_3F$, $CH_2F_2$, $C_4F_8$, $C_4F_6$, $N_2$, $O_2$, CO, $CO_2$, He, Ne, Ar and another suitable gas. In some examples, the CCP type RIE process is performed with a high frequency (HF) power of about 100 W to about 1500 W, and a low frequency (LF) power of about 100 W to about 1000 W.

Figures 1, 1N, 2:
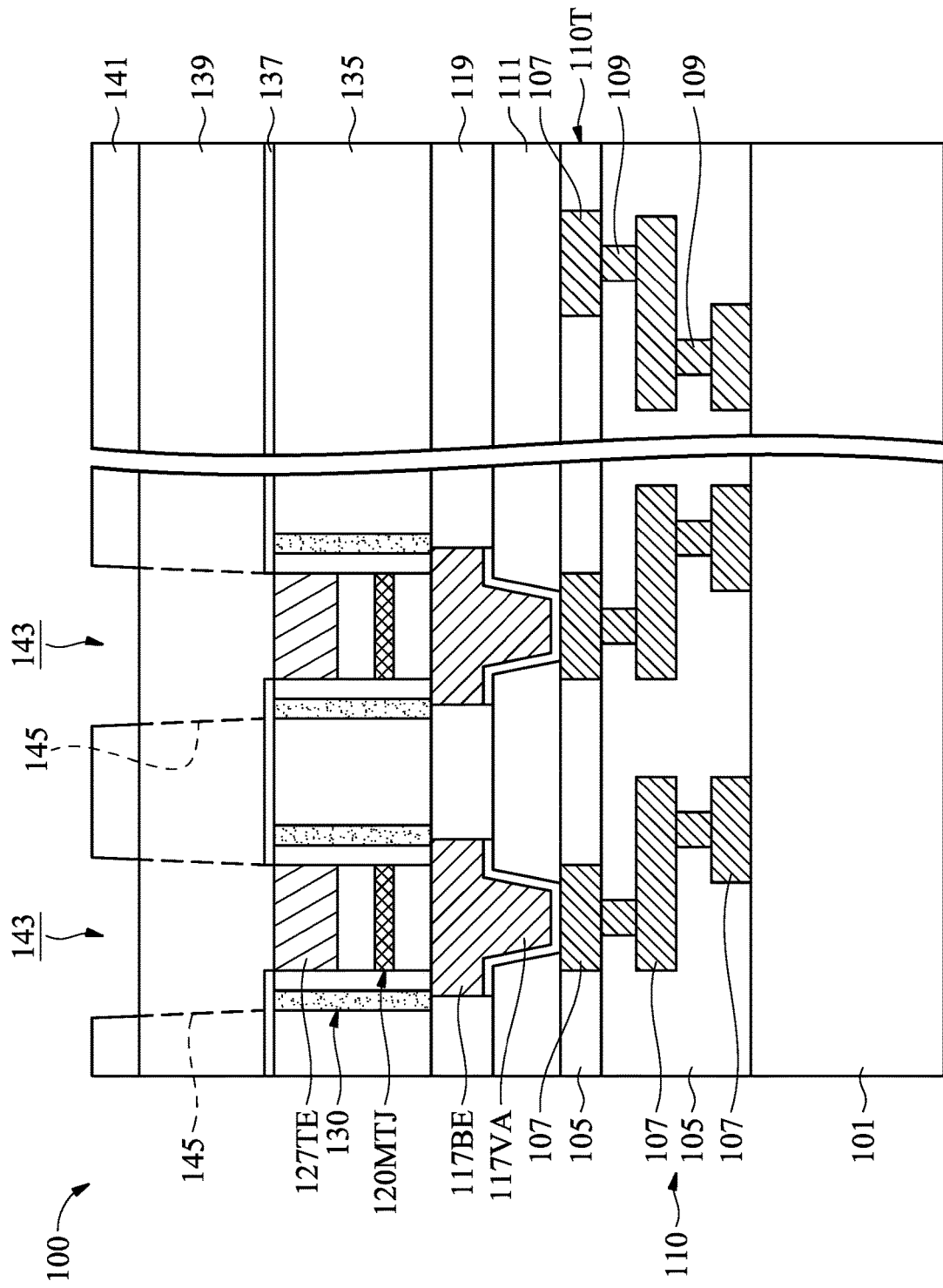
Figures 1, 10:
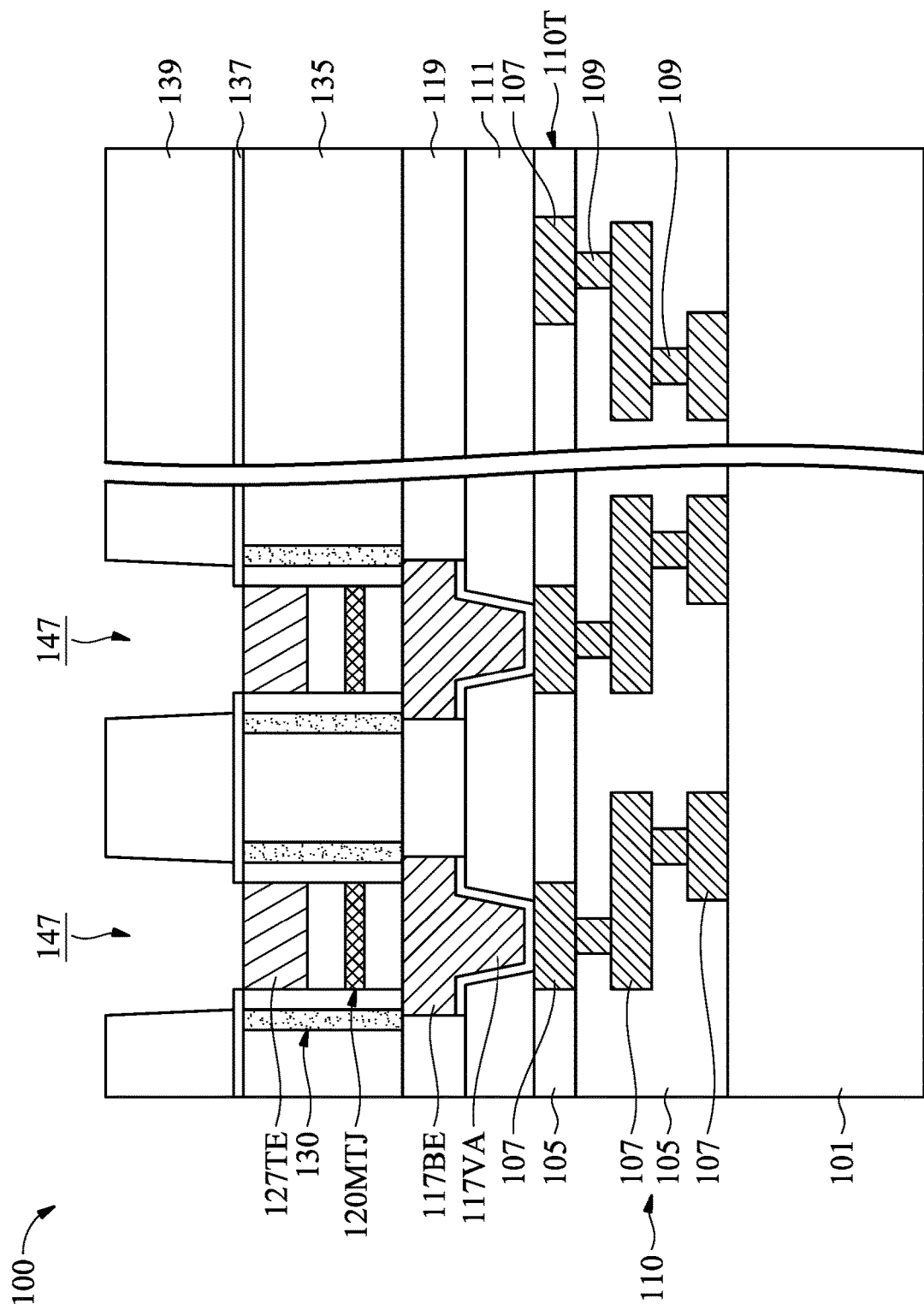
Figures 2, 10:
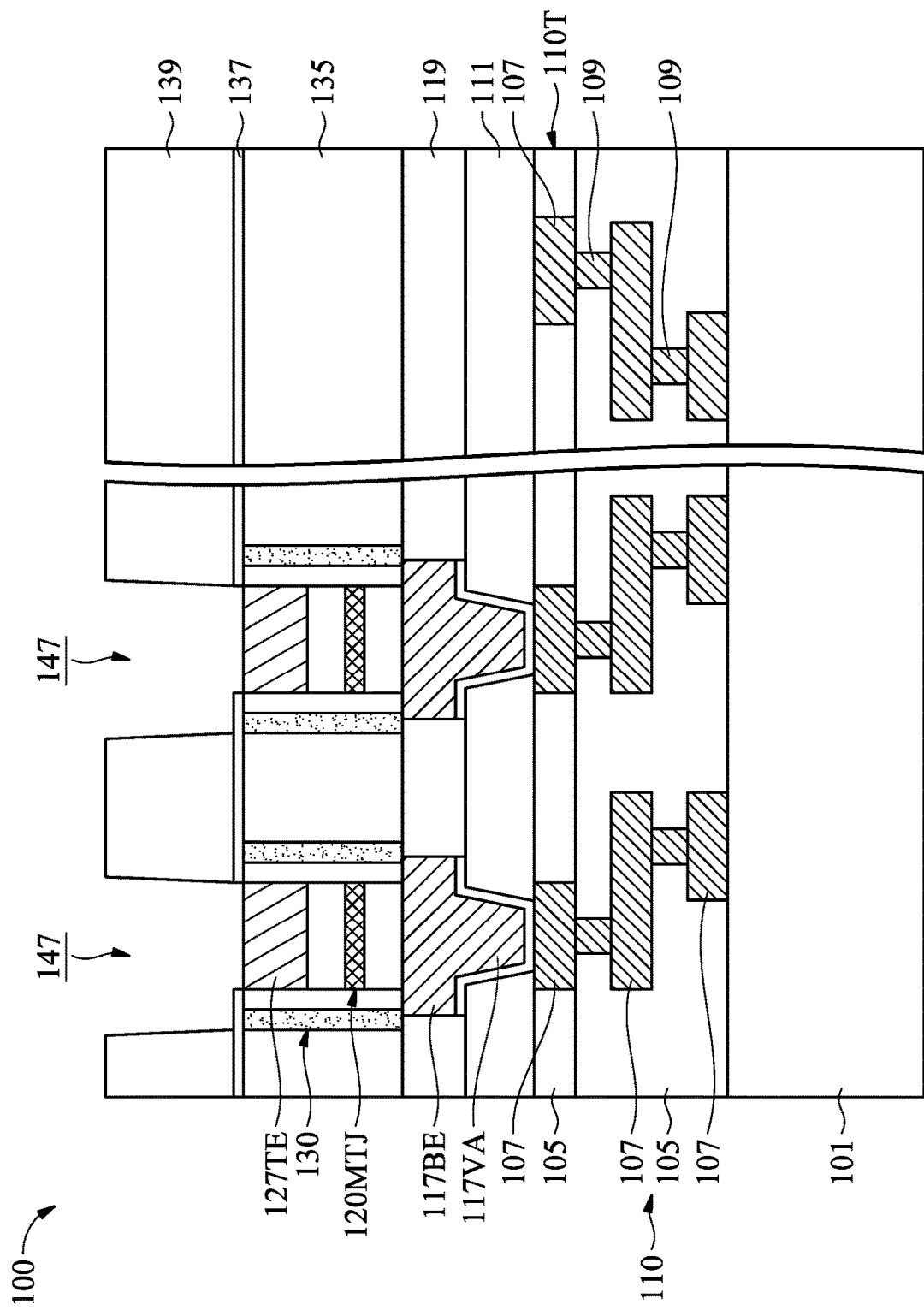

Referring to FIG. 1N-2, the patterned photoresist 141 formed on the second dielectric layer 139 has an overlay shift with respect to the top electrodes 127TE in accordance with some embodiments. The positions of the openings 143 of the patterned photoresist 141 are slightly shifted from the positions of the top electrodes 127TE due to alignment shift in the photolithography process of forming the patterned photoresist 141. When MRAM technology nodes are developed from N28 to N5 or beyond, the alignment accuracy of the photolithography process has become difficult. The regions 145 of the second dielectric layer 139 (FIG. 1N-2) will be removed in an etching process to form the via holes 147, as shown in FIG. 1O-2 in accordance with some embodiments. If the patterned etch stop layer 137 is not present, the overlay shift of the patterned photoresist 141 will cause damage to the MTJ structures 120MTJ in the etching process of forming the via holes 147. According to the embodiments of the disclosure, the patterned etch stop layer 137 covering the spacers 130 can prevent the MTJ structures 120MTJ from damaging in the etching process of forming the via holes 147, even if the patterned photoresist 141 has an overlay shift with respect to the top electrodes 127TE. Therefore, a subsequently formed top electrode via in the via hole 147 can be a self-aligned via that provides benefits in advanced MRAM technology nodes of N5 or beyond.

Figure 1P:
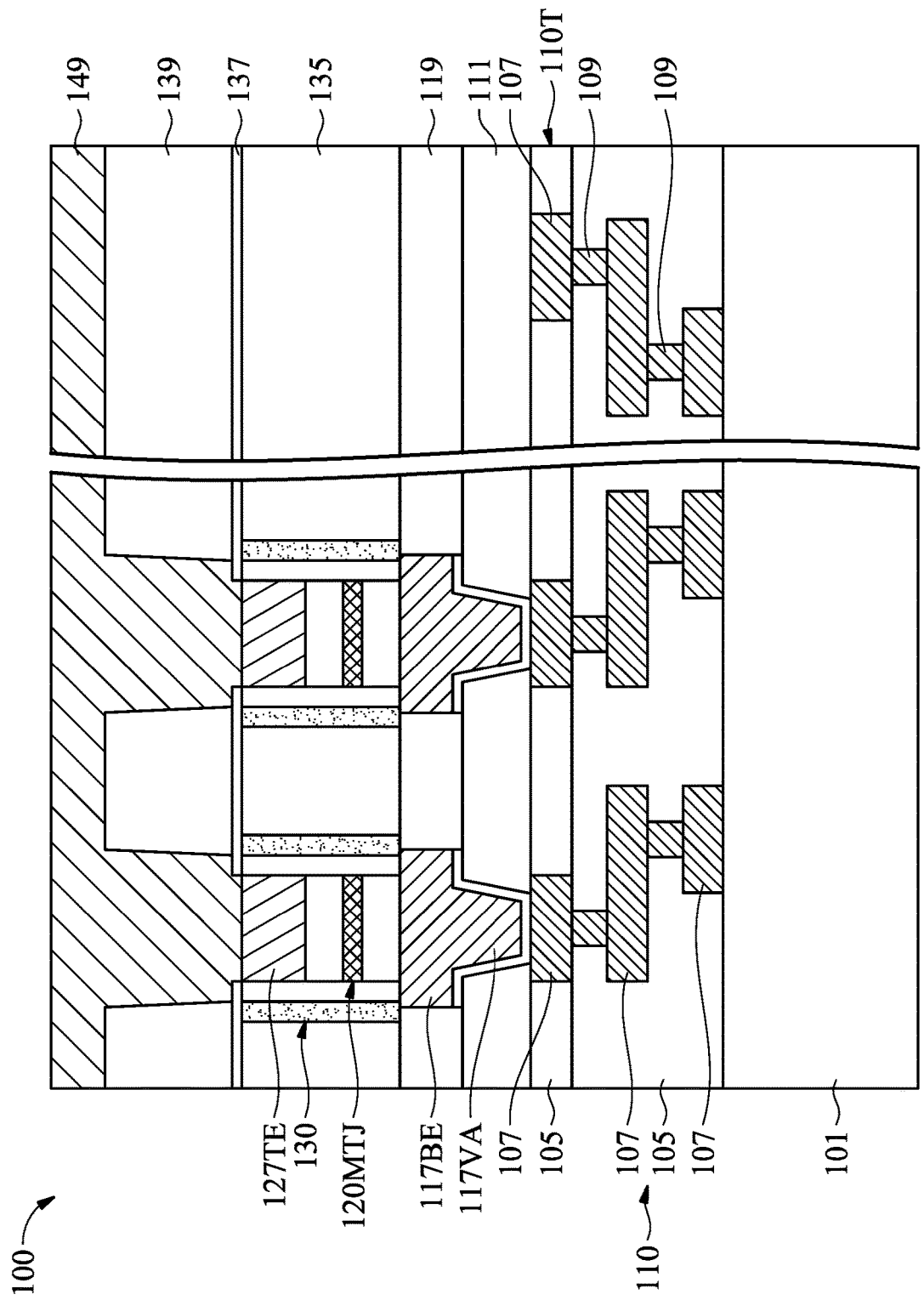
Figure 1Q:
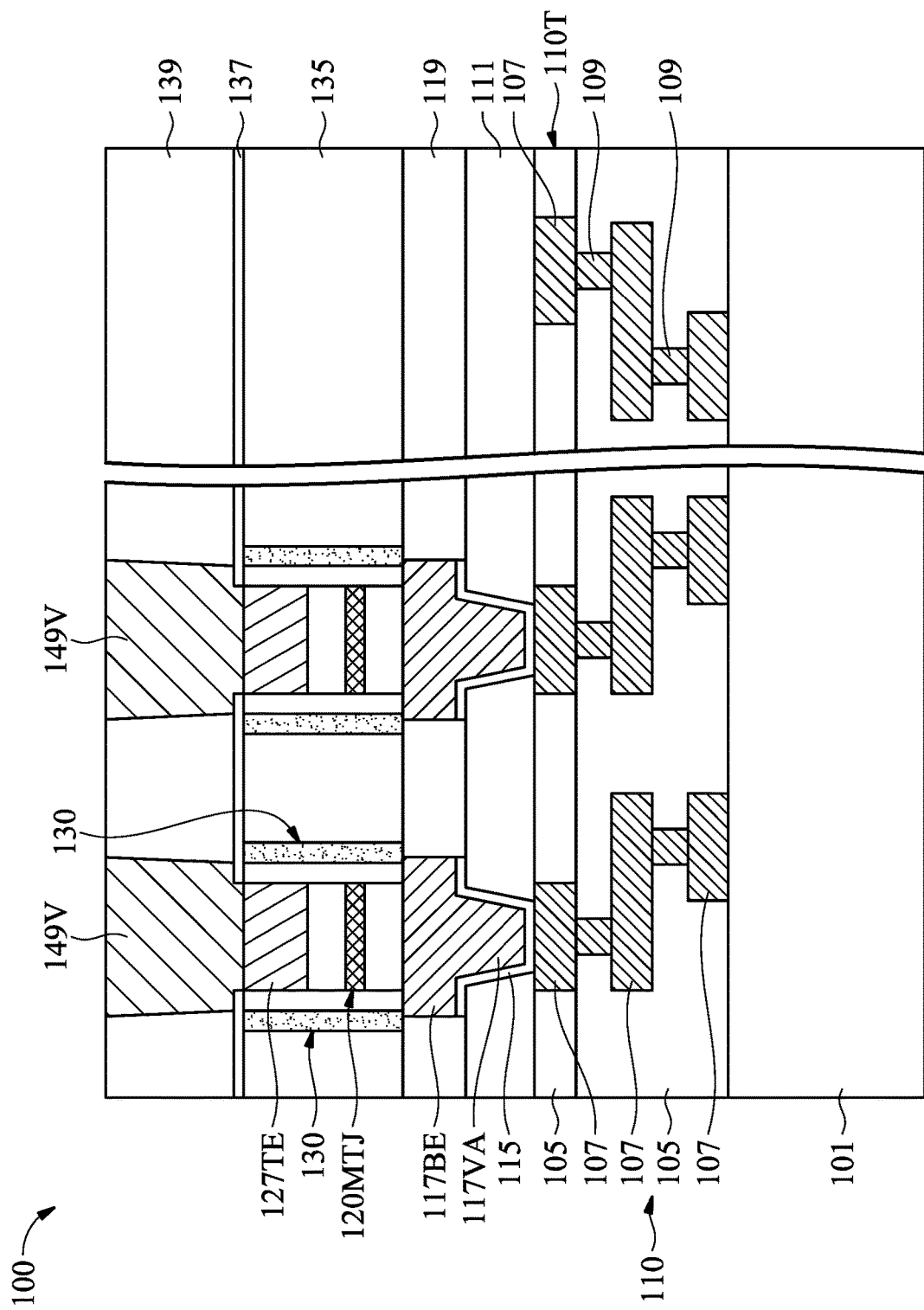

Next, referring to FIG. 1P, a conductive material layer 149 is deposited on the second dielectric layer 139 and to fill the via holes 147 in accordance with some embodiments. The conductive material layer 149 is made of low electrical resistance materials such as metal, metal alloy, metal nitride or a combination thereof. The conductive material layer 149 is for example titanium nitride (TiN), tantalum (Ta), copper (Cu), tantalum nitride (TaN), titanium (Ti), cobalt (Co), tungsten (W), aluminum (Al), gold (Au), aluminum-copper alloy (AlCu) or other suitable conductive material(s) or layered combination thereof. The conductive material layer 149 may be deposited using PVD, CVD, ALD, or other suitable deposition process. In some examples, the conductive material layer 149 has a thickness that is in a range from about 500 Å to about 1000 Å.

Afterwards, referring to FIG. 1Q, a planarization process is performed on the conductive material layer 149 to form multiple top electrode vias 149VA on the respective top electrodes 127TE in accordance with some embodiments. The planarization process is for example a CMP process that removes excess portions of the conductive material layer 149 on the second dielectric layer 139. The top electrode via 149VA is also formed on a portion of the patterned etch stop layer 137.

Figure 2A:
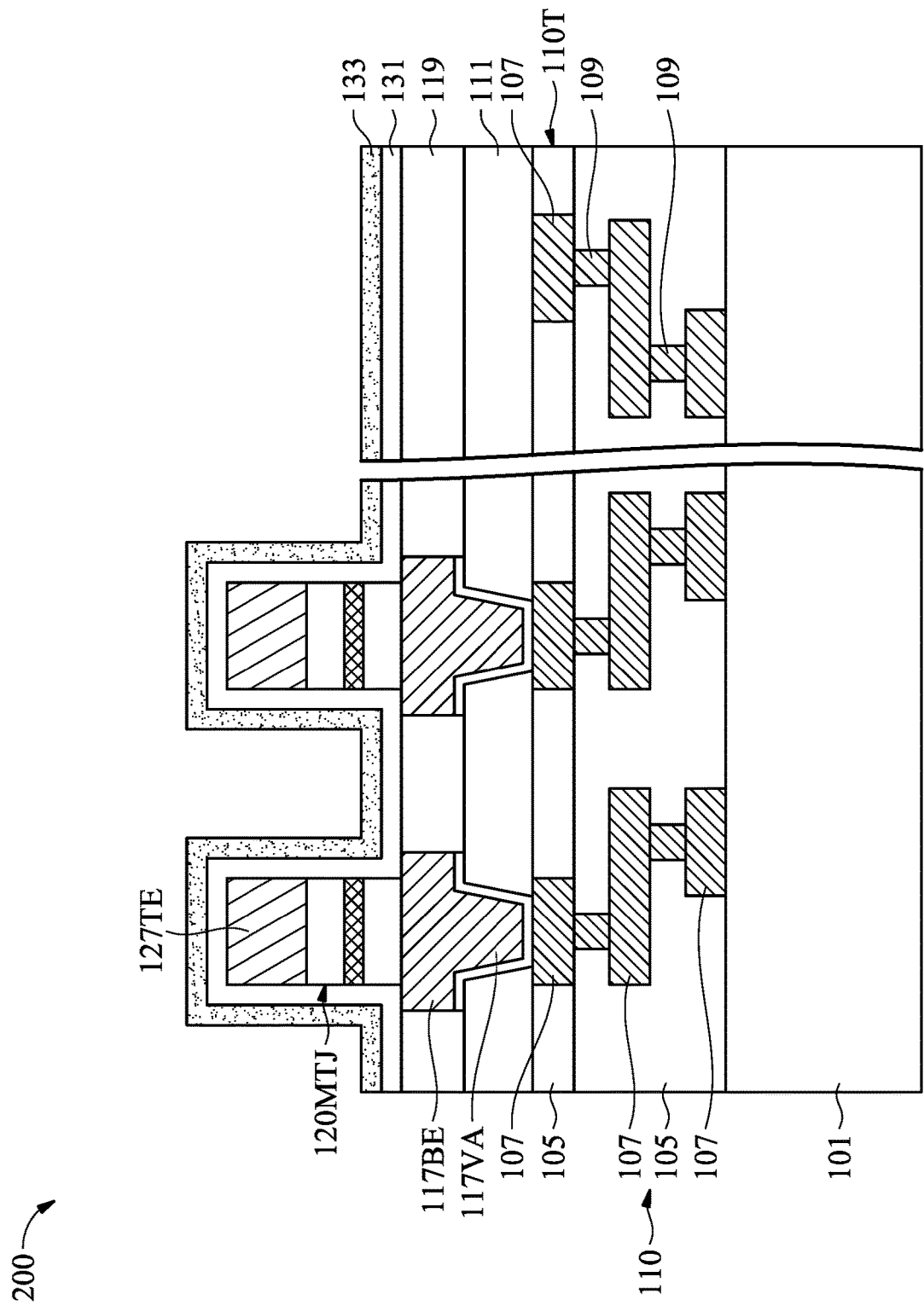
FIGS. 2A, 2B and 2C illustrate cross-sectional views of respective structures at several stages of fabricating an MRAM device, in accordance with some embodiments.
Figure 2B:
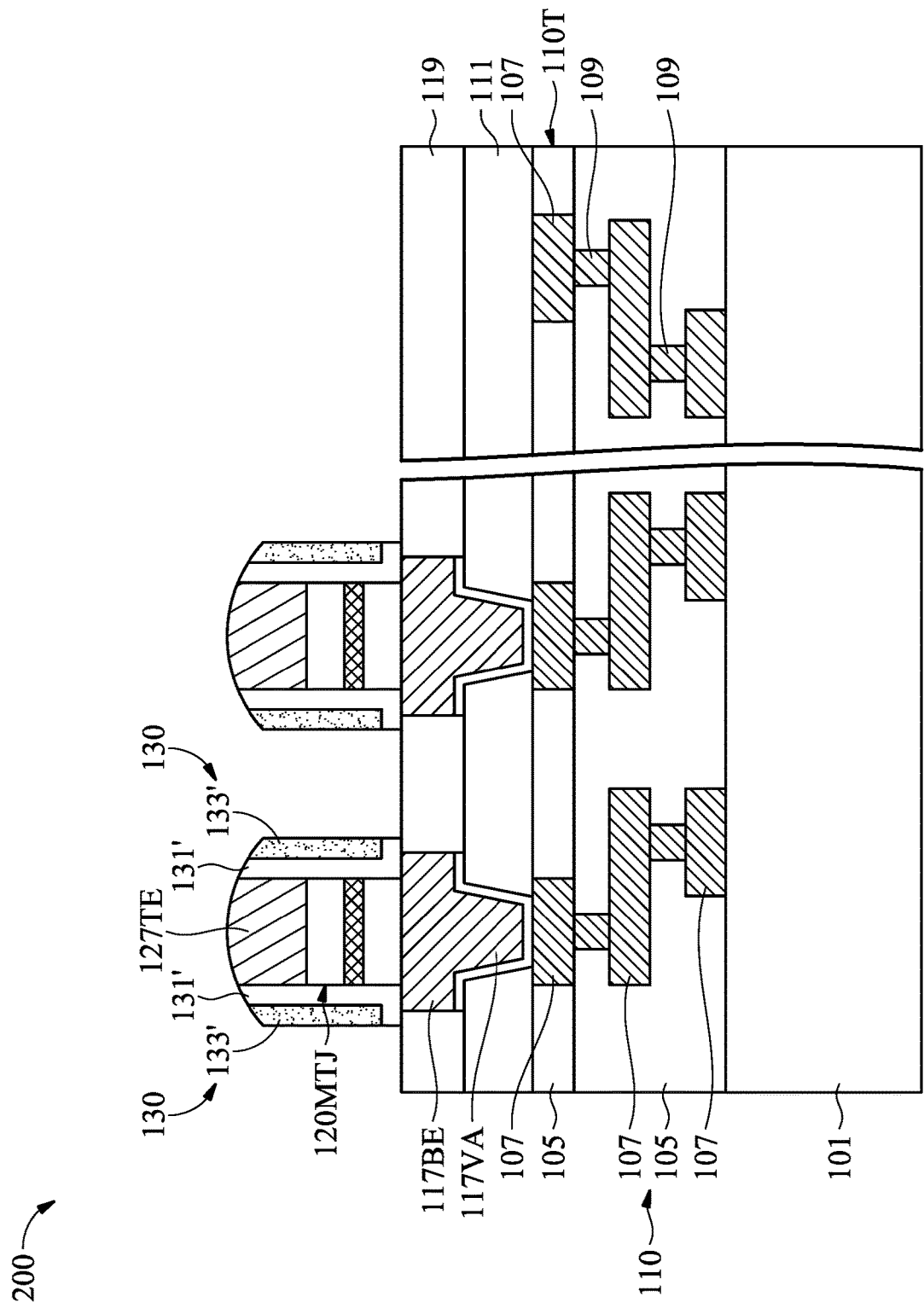
Figure 2C:
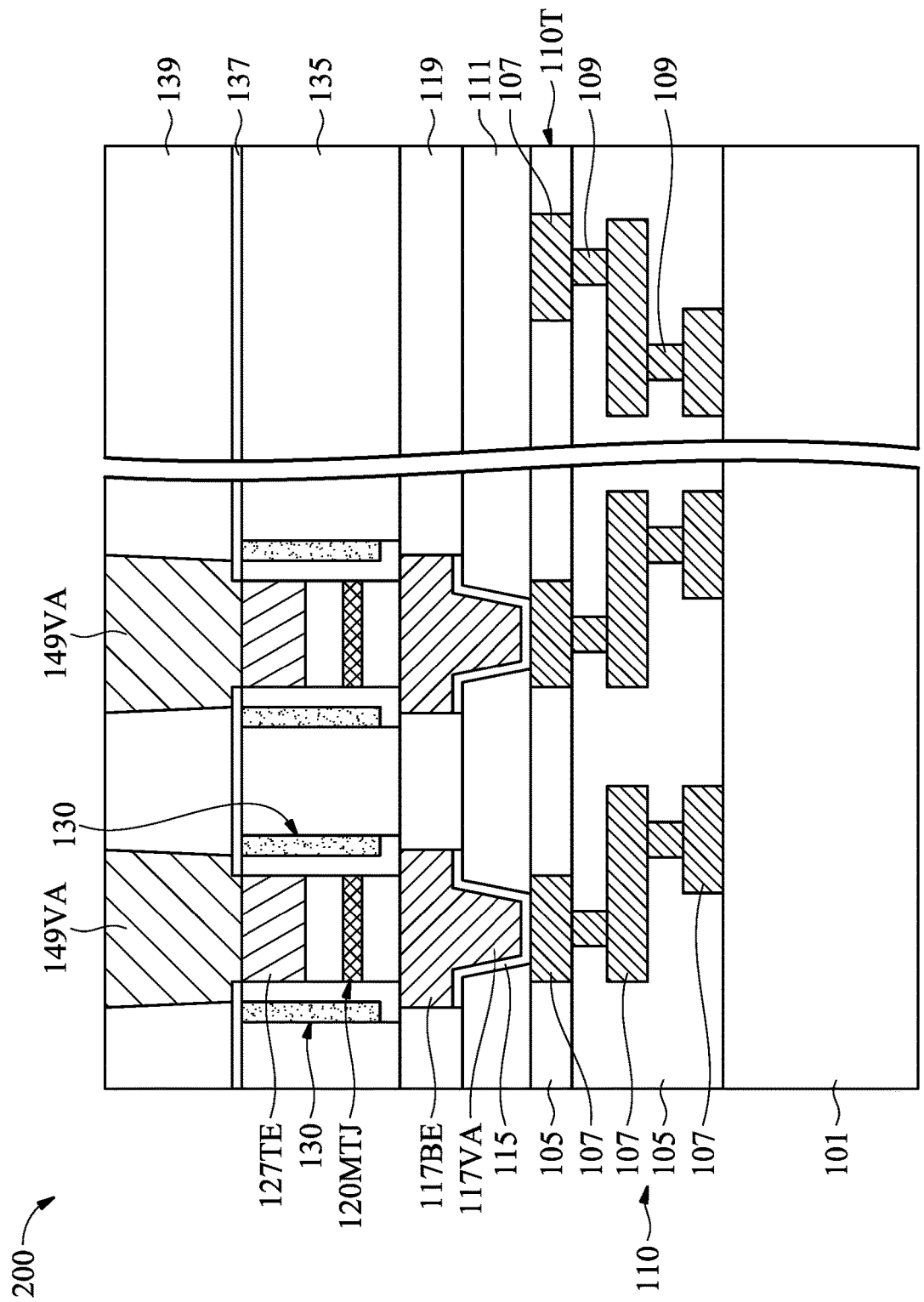

FIGS. 2A to 2C illustrate cross-sectional views of respective structures at several stages of fabricating an MRAM device 200, in accordance with some embodiments. Referring to FIG. 2A, after the structure of FIG. 1F is formed, a first spacer layer 131 and a second spacer layer 133 are conformally deposited in sequence on the top surfaces of the top electrodes 127TE, the sidewalls of the top electrodes 127TE, the sidewalls of the MTJ structures 120MTJ, and the exposed top surfaces of the etch stop layer 119 and the bottom electrodes 117BE in accordance with some embodiments. The materials of the first spacer layer 131 and the second spacer layer 133 include silicon nitride (SiN), silicon carbide (SiC) or another dielectric material. In some instances, the first spacer layer 131 and the second spacer layer 133 are made of different materials. For example, the first spacer layer 131 is made of SiC, and the second spacer layer 133 is made of SiN. The first spacer layer 131 and the second spacer layer 133 may be deposited separately by PECVD, ALD or another deposition process at a temperature of about 180° C. to about 350° C. In some examples, each of the first spacer layer 131 and the second spacer layer 133 has a thickness in a range from about 50 Å to about 250 Å.

Next, referring to FIG. 2B, the first spacer layer 131 and the second spacer layer 133 are etched to form spacers 130 on the sidewalls of the top electrodes 127TE and the MTJ structures 120MTJ using an anisotropic etching process in accordance with some embodiments. The spacers 130 are formed to cover the exposed top surfaces of the bottom electrodes 117BE and a partial top surface of the etch stop layer 119. The anisotropic etching process may be an ICP type RIE process. The ICP type RIE process may use an etching gas that is selected from a group consisting of $CH_4$, $H_2$, $Cl_2$, HBr, $N_2$, $CF_4$, $CHF_3$, $C_4F_6$, $CH_3F$, $SiCl_4$, CO, $CO_2$, $O_2$, He, Ne, Ar and another suitable gas. In some examples, the ICP type RIE process is performed with a transformer coupled plasma (TCP) power in a range from about 100 W to about 2000 W, and a bias voltage in a range from about 0V to about 800V.

Afterwards, the processes that are the same as or similar to those described with respect to FIGS. 1K to 1Q are performed on the structure of FIG. 2B, and the MRAM device 200 is fabricated as shown in FIG. 2C in accordance with some embodiments. The MRAM device 200 includes the spacers 130 on the sidewalls of the top electrode 127TE and the MTJ structure 120MTJ. Each of the spacers 130 includes a L-shaped first spacer 131 that is in contact with the sidewalls of the top electrode 127TE and the MTJ structure 120MTJ and extended on the partial top surfaces of the bottom electrode 117BE and the etch stop layer 119. The spacer 130 also includes a second spacer 133 on the sidewall of the L-shaped first spacer 131. The other elements of the MRAM device 200 may be the same as or similar to those corresponding elements of the MRAM device 100 as described with respect to FIGS. 1A to 1Q.

In addition, an upper interconnect structure (not shown) may be formed above the top electrode vias 149VA of the MRAM devices. The upper interconnect structure includes multiple intermetal dielectric (IMD) layers, and multiple metal lines and conductive vias embedded in the IMD layers. The metal lines and conductive vias of the upper interconnect structure are electrically coupled to the top electrodes 127TE through the top electrode vias 149VA for providing or transferring electrical signals to the MTJ structures 120MTJ.

Moreover, the metal lines 107 in the uppermost IMD layer 105 of the lower interconnect structure 110 is electrically coupled to the bottom electrodes 117BE through the bottom electrode vias 117VA for providing or transferring electrical signals to the MTJ structures 120MTJ. The upper interconnect structure and the lower interconnect structure 110 may be collectively referred to as a back-end-of-line (BEOL) interconnect structure. The MTJ structures 120MTJ may be formed within the BEOL interconnection structure and between two adjacent metal line layers of the BEOL interconnection structure.

When the magnetic moment of the free layer of the MTJ structure 120MTJ is the same direction as the magnetic moment of the pinned layer of the MTJ structure 120MTJ, electrons can more readily tunnel through the insulating barrier layer 123. This causes the MTJ structure 120MTJ to be in a relatively low resistive state. Thus, with a properly polarized voltage applied, an electric current can flow through the MTJ structure 120MTJ between the bottom electrode 117BE and the top electrode 127TE.

With an oppositely polarized voltage applied, the direction of the magnetic moment of the free layer of the MTJ structure 120MTJ can be set to oppose the direction of the magnetic moment of the pinned layer of the MTJ structure 120MTJ. In this state, it is more difficult for electrons to tunnel through the insulating barrier layer 123. This causes the MTJ structure 120MTJ to be in a high resistive state. The different resistive states may be used to represent digital values. For example, the high resistive state may be used to represent a digital "0" while the low resistive state may be used to represent a digital "1". In order to accurately control and improve the electrical and magnetic characteristics and the performances of MRAM devices, it should avoid damaging the MTJ structures 120MTJ during the fabrication of MRAM devices.

According to some embodiments of the disclosure, the patterned etch stop layer 137 is selectively deposited on the spacers 130 and the first dielectric layer 135 by a DoD process to expose the top electrodes 127TE. Next, the second dielectric layer 139 is deposited on the patterned etch stop layer 137 and the top electrodes 127TE. The second dielectric layer 139 is etched to form the via holes 147 that expose the top electrodes 127TE. The second dielectric layer 139 has an etching selectivity to the patterned etch stop layer 137 in the etching process of forming the via holes 147, and the etching selectivity is in a range from about 10 to about 20. The patterned etch stop layer 137 can protect the spacers 130 and can prevent the MTJ structures 120MTJ from damaging in the etching process. Even if the via holes 147 are formed with overlay shift to the locations of the top electrodes 127TE due to the overlay shift in the photolithography process of forming the patterned photoresist 141, there is no damage to the MTJ structures 120MTJ in the embodiments of the disclosure. Moreover, the top electrode vias 149VA may be referred to as self-aligned top electrode vias formed on the top electrodes 127TE and a portion of the patterned etch stop layer 137.

Therefore, the embodiments of the disclosure can widen the overlay window of the photolithography process of forming the via holes 147 for the top electrode vias 149VA. In addition, the rework of the patterned photoresist 141 can be reduced or eliminated to achieve a lower cost of fabricating the MRAM devices. Moreover, the embodiments of the disclosure can lower the damage risk of the spacers 130 and the MTJ structures 120MTJ to enhance the electrical and magnetic characteristics, reliability and performances of the MRAM devices. According to the above mentioned benefits, the embodiments of the disclosure are suitable for the advanced MRAM technology nodes of N28 to N5 or beyond.

In some embodiments, an MRAM device is provided. The MRAM device includes a bottom electrode over a substrate, a magnetic tunnel junction (MTJ) structure on the bottom electrode and a top electrode on the MTJ structure. The MRAM device also includes spacers on sidewalls of the top electrode and the MTJ structure. The MRAM device further includes a first etch stop layer on the spacers. A bottommost surface of the first etch stop layer covers a topmost surface of the spacers. In addition, the MRAM device includes a top electrode via on the top electrode and the first etch stop layer.

In some embodiments, an MRAM device is provided. The MRAM device includes a bottom electrode over a semiconductor substrate, a magnetic tunnel junction (MTJ) structure on the bottom electrode and a top electrode on the MTJ structure. The MRAM device also includes a first spacer on sidewalls of the top electrode and the MTJ structure. The MRAM device further includes a second spacer on sidewalls of the first spacer. In addition, the MRAM device includes a dielectric layer surrounding and in direct contact with the first spacer and the second spacer. The MRAM device also includes an etch stop layer on the first spacer, the second spacer and the dielectric layer. The MRAM device further includes a top electrode via covering the top electrode and a top surface and a sidewall of the etch stop layer.

In some embodiments, an MRAM device is provided. The MRAM device includes a bottom electrode, a first etch stop layer surrounding the bottom electrode, a magnetic tunnel junction (MTJ) structure on the bottom electrode and a top electrode on the MTJ structure. The MRAM device also includes spacers on the bottom electrode and the first etch stop layer and surrounding the top electrode and the MTJ structure. The MRAM device further includes a second etch stop layer on the spacers. A thickness of the second etch stop layer is less than a thickness of the first etch stop layer. In addition, the MRAM device includes a top electrode via on the top electrode and the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic random access memory (MRAM) device, comprising:
   a bottom electrode over a substrate;
   a first etch stop layer surrounding the bottom electrode;
   a magnetic tunnel junction (MTJ) structure on the bottom electrode;
   a top electrode on the MTJ structure;
   spacers on sidewalls of the top electrode and the MTJ structure, wherein the spacers have a first portion in direct contact with the first etch stop layer and a second portion in direct contact with the bottom electrode;
   a second etch stop layer on the spacers, wherein a bottommost surface of the second etch stop layer covers a topmost surface of the spacers, and the bottommost surface of the second etch stop layer is higher than a bottom surface of the spacers; and
   a top electrode via on the top electrode and the second etch stop layer.

2. The MRAM device as claimed in claim 1, wherein a bottom surface of the spacers covers the bottom electrode.

3. The MRAM device as claimed in claim 1, wherein an interface between the second etch stop layer and the spacers is level with an interface between the top electrode via and the top electrode.

4. The MRAM device as claimed in claim 1, further comprising:
   a bottom electrode via under the bottom electrode.

5. The MRAM device as claimed in claim 4, further comprising:
   an interlayer dielectric (ILD) layer surrounding the bottom electrode via.

6. A magnetic random access memory (MRAM) device, comprising:
   a bottom electrode over a semiconductor substrate;
   a magnetic tunnel junction (MTJ) structure on the bottom electrode;

a top electrode on the MTJ structure;
a first spacer on sidewalls of the top electrode and the MTJ structure;
a second spacer on sidewalls of the first spacer;
a dielectric layer surrounding and in direct contact with the first spacer and the second spacer;
an etch stop layer on the first spacer, the second spacer and the dielectric layer, wherein the etch stop layer is in direct contact with the first spacer, the second spacer and the dielectric layer; and
a top electrode via covering the top electrode and a top surface and a sidewall of the etch stop layer.

7. The MRAM device as claimed in claim 6, wherein a bottom surface of the first spacer is lower than a bottom surface of the second spacer.

8. The MRAM device as claimed in claim 6, wherein the second spacer is separated from the top electrode by the first spacer.

9. The MRAM device as claimed in claim 6, wherein the first spacer is in direct contact with a top surface of the bottom electrode, and a portion of the sidewalls of the first spacer protrudes from a sidewall of the bottom electrode.

10. The MRAM device as claimed in claim 6, wherein the etch stop layer is made of a high electrical resistance material or a high dielectric constant material.

11. The MRAM device as claimed in claim 6, wherein the first spacer is L-shaped.

12. A magnetic random access memory (MRAM) device, comprising:
a bottom electrode;
a first etch stop layer surrounding the bottom electrode;
a magnetic tunnel junction (MTJ) structure on the bottom electrode;
a top electrode on the MTJ structure;
spacers on the bottom electrode and the first etch stop layer and surrounding the top electrode and the MTJ structure, wherein an interface between the spacers and the first etch stop layer is level with an interface be the MTJ structure and the bottom electrode;
a second etch stop layer on the spacers, wherein a thickness of the second etch stop layer is less than a thickness of the first etch stop layer; and
a top electrode via on the top electrode and the second etch stop layer.

13. The MRAM device as claimed in claim 1, wherein the bottommost surface of the first etch stop layer is higher than a bottom surface of the MTJ structure.

14. The MRAM device as claimed in claim 1, wherein a sidewall of the spacers protrudes from a sidewall of the bottom electrode.

15. The MRAM device as claimed in claim 1, wherein there is an interface between the spacers and the first etch stop layer.

16. The MRAM device as claimed in claim 1, wherein an interface between the spacers and the first etch stop layer is level with an interface between the MTJ structure and the bottom electrode.

17. The MRAM device as claimed in claim 1, wherein a bottom surface of the MTJ structure is level with a top surface of the first etch stop layer.

18. The MRAM device as claimed in claim 12, wherein the spacers comprise a first spacer and a second spacer on the first spacer, and wherein a bottom surface of the second spacer is higher than a top surface of the bottom electrode.

19. The MRAM device as claimed in claim 18, wherein the bottom surface of the second spacer is higher than a top surface of the first etch stop layer.

20. The MRAM device as claimed in claim 18, wherein the first etch stop layer is in direct contact with the first spacer and separated from the second spacer.

* * * * *